United States Patent [19]
Koizumi et al.

[11] Patent Number: 5,994,741
[45] Date of Patent: Nov. 30, 1999

[54] SEMICONDUCTOR DEVICE HAVING DIGITAL AND ANALOG CIRCUITS INTEGRATED ON ONE CHIP

[75] Inventors: Masayuki Koizumi; Haruyuki Miyata, both of Yokohama, Japan

[73] Assignee: Kabushiki Kaisha Toshiba, Kawasaki, Japan

[21] Appl. No.: 08/125,396

[22] Filed: Sep. 23, 1993

[30] Foreign Application Priority Data

Sep. 25, 1992 [JP] Japan ................................ 4-256296
Sep. 9, 1993 [JP] Japan ................................ 5-224360

[51] Int. Cl.$^6$ ............................ H01L 29/76; H01L 29/94; H01L 31/062; H01L 31/113
[52] U.S. Cl. ................................ 257/355; 257/356
[58] Field of Search ................................ 257/355, 356, 257/357, 36 E, 369, 376

[56] References Cited

U.S. PATENT DOCUMENTS 4,595,909  6/1986  Jarrett ................................ 340/347

FOREIGN PATENT DOCUMENTS 4-251970  9/1992  Japan .

*Primary Examiner*—Stephen D. Meier
*Attorney, Agent, or Firm*—Banner & Witcoff, Ltd.

[57] ABSTRACT

First and second well regions of N conductivity type are formed in a P-type semiconductor substrate. A digital circuit is formed in the first well region. An analog circuit is formed in the second well region. A power source wiring for supplying a bias potential is connected to the substrate. The power source wiring is connected to a power source terminal which is different from the power source terminal of the digital circuit.

33 Claims, 17 Drawing Sheets

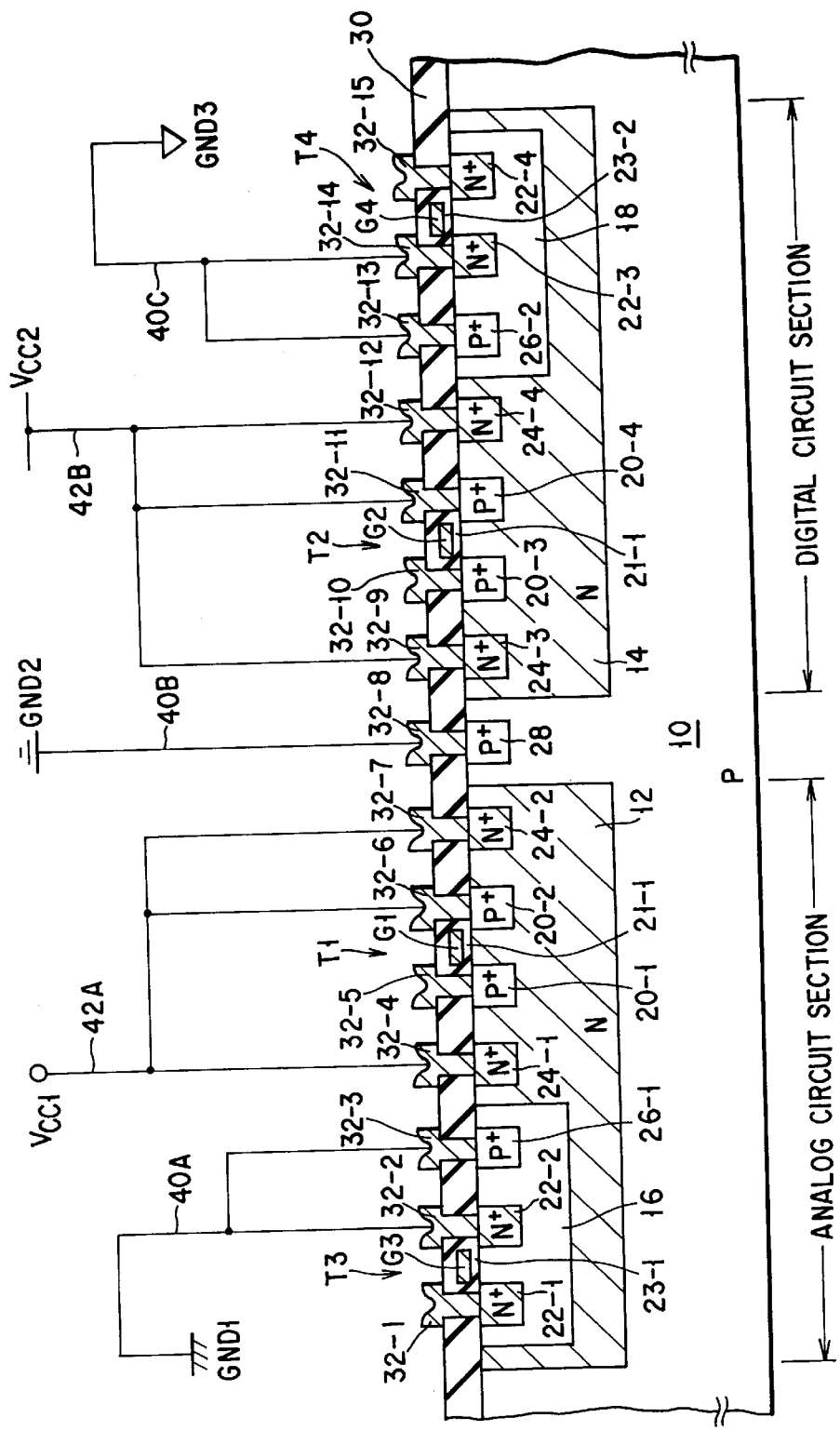
F I G. 1

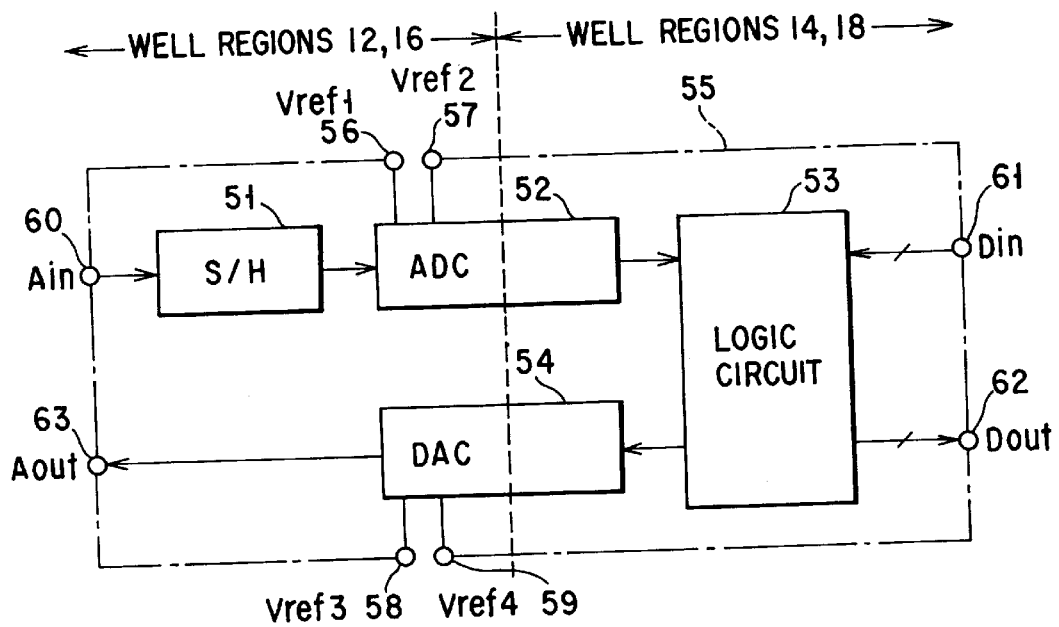
F I G. 2
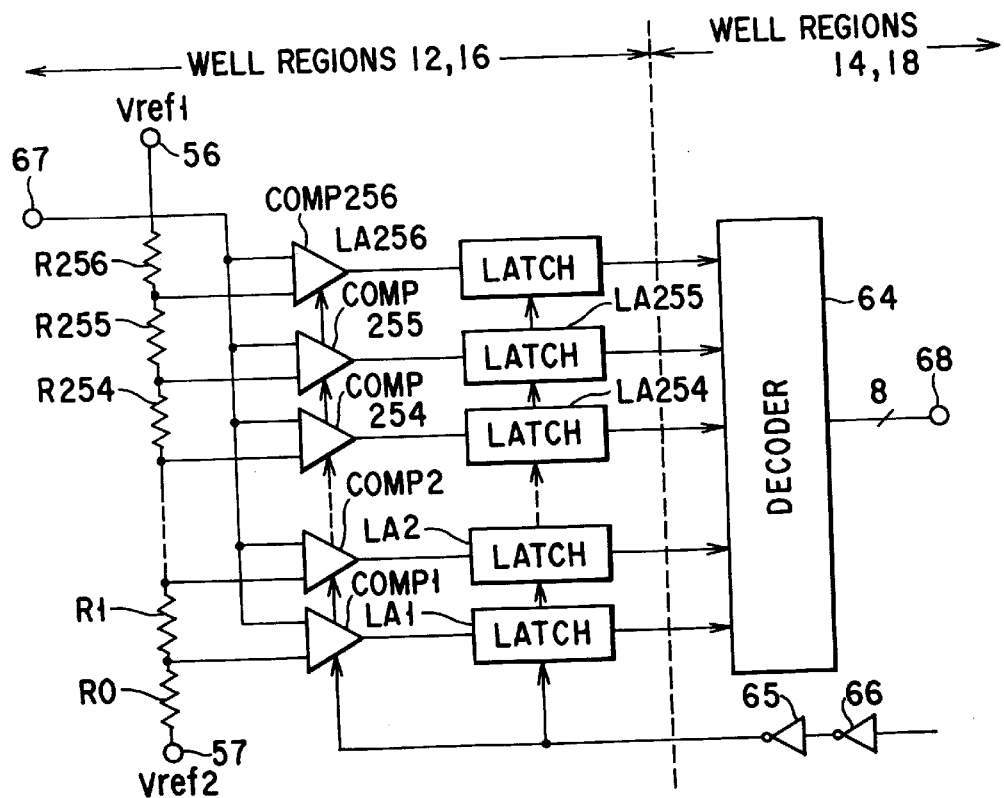
F I G. 3

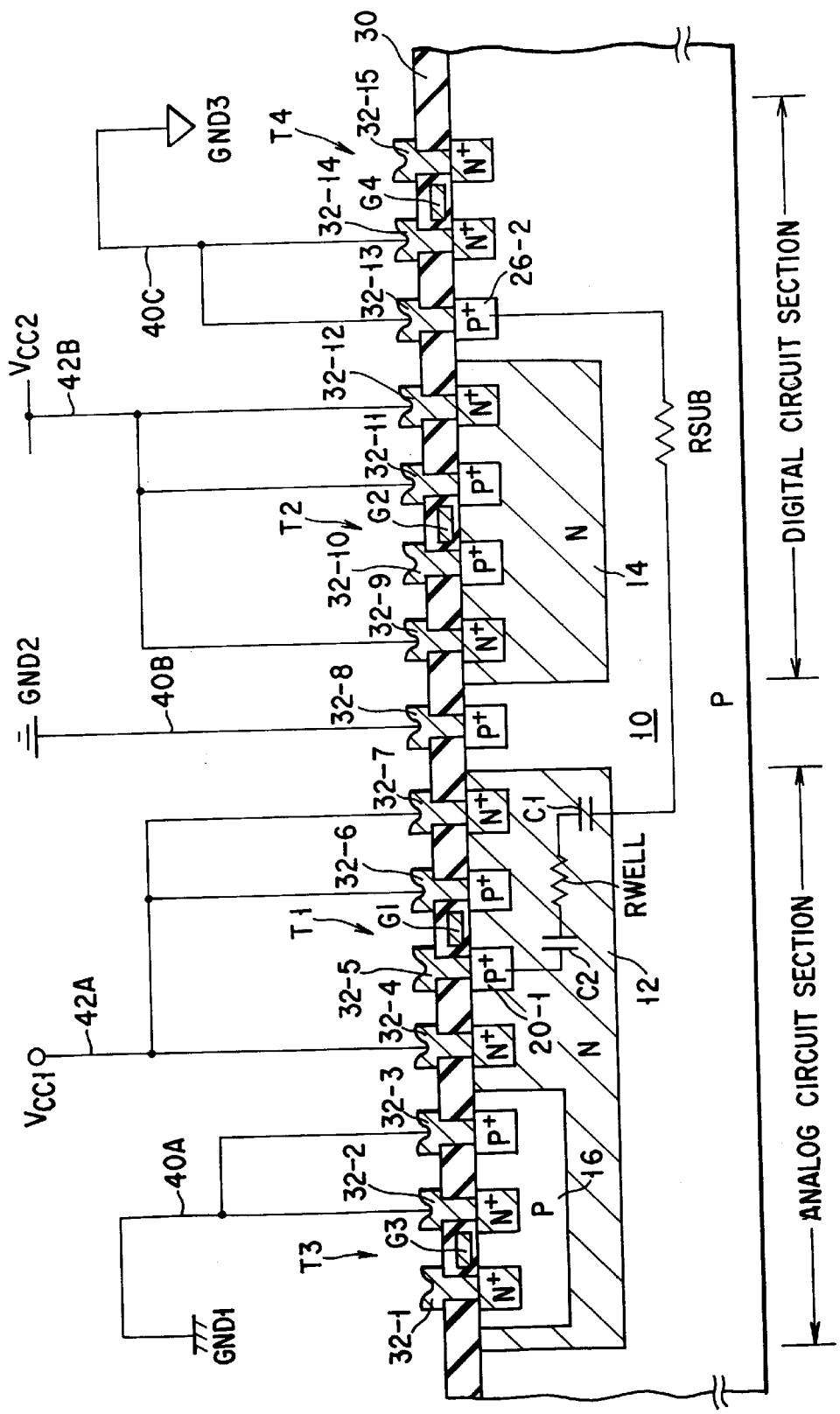
F I G. 8

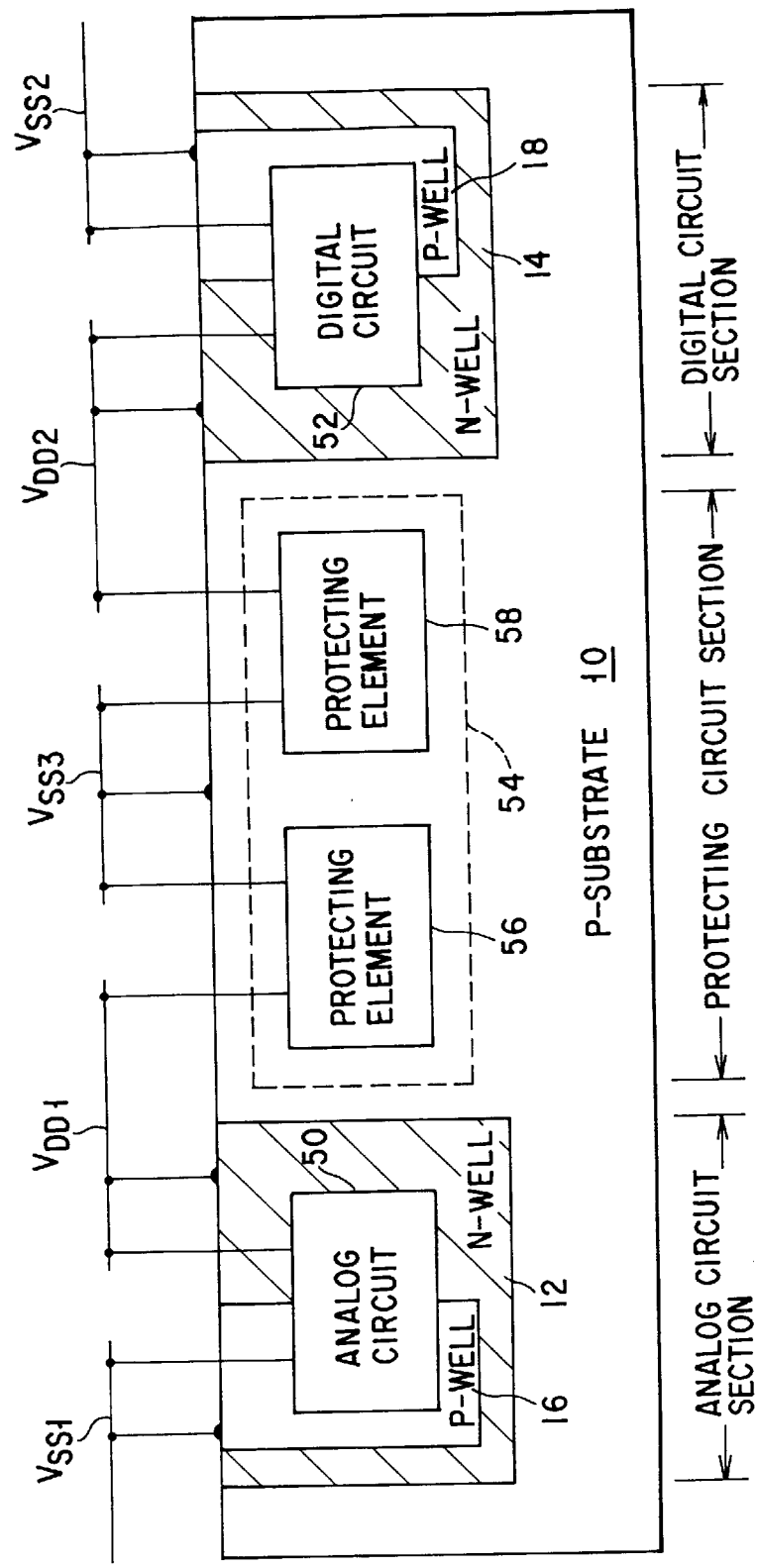
F I G. 12

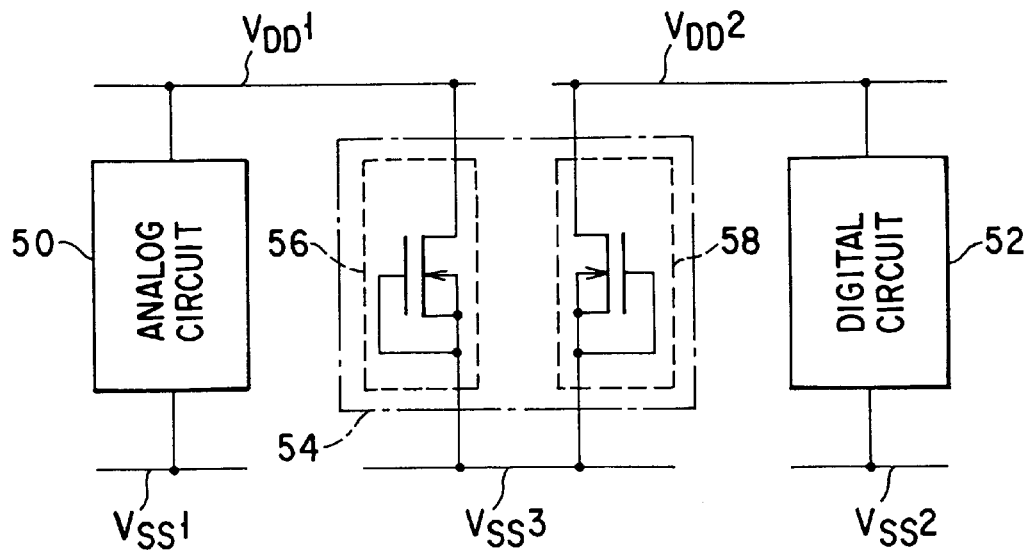
F I G. 13
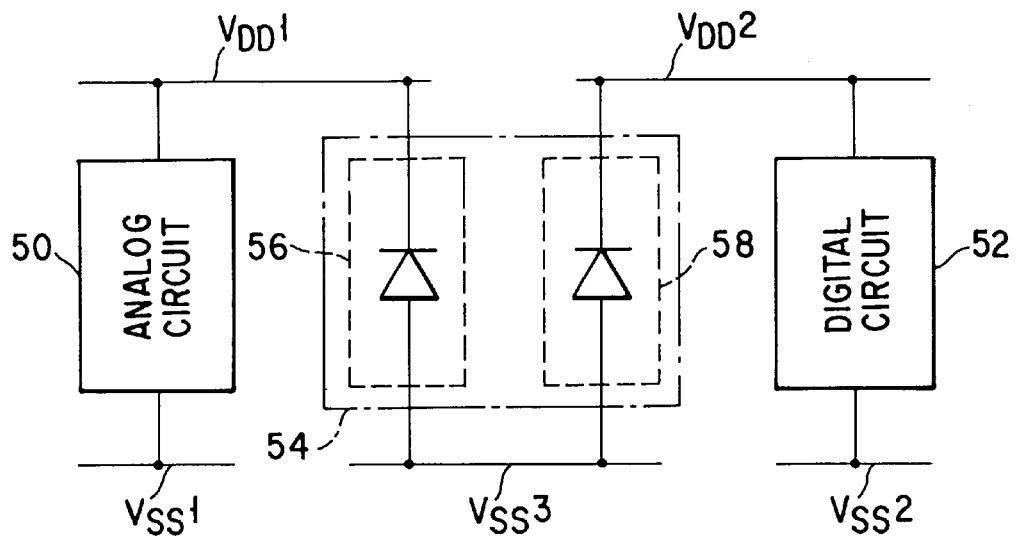
F I G. 14

SEMICONDUCTOR DEVICE HAVING DIGITAL AND ANALOG CIRCUITS INTEGRATED ON ONE CHIP

BACKGROUND OF THE INVENTION

1. Field of the Invention

This invention relates to a semiconductor integrated circuit device, and more particularly to a semiconductor integrated circuit device having analog and digital circuits formed in one semiconductor substrate.

2. Description of the Related Art

As a semiconductor device having digital and analog circuits formed on the same chip, a semiconductor device is disclosed in Japanese Patent Disclosure No. H.4-251970 (Japanese Patent Application No. H.3-1232).

In the semiconductor device disclosed in Japanese Patent Disclosure No. H.4-251970, two wells are formed in a substrate, the analog circuit is formed in one of the two wells and the digital circuit is formed in the other well.

With the above structure, since each of the two well regions is surrounded by the substrate, the analog circuit and the digital circuit can be electrically isolated from each other not only in the surface portion of the substrate but also in the deep portion of the substrate. Since the substrate absorbs electrical noise generated from the digital circuit, transmission of the electrical noise can be prevented by the substrate so that mutual interference between the digital circuit and the analog circuit can be suppressed.

However, in the semiconductor device disclosed in Japanese Patent Disclosure No. H.4-251970, influence by the mutual interference that the characteristic of the analog circuit will fluctuate still remains. This is considered because the substrate potential is derived from the power source of the digital circuit via a wiring which is laid in a complicated configuration. For example, if undershoot of the power source potential or the like occurs in the digital circuit section, this is transmitted as noise and input to the substrate via the wiring.

A P-type region of high impurity concentration which is electrically connected to the wiring is formed in the substrate. The P-type high impurity concentration region is disposed near the well region in which the analog circuit is formed. Therefore, noise is input from the P-type high impurity concentration region 106 to the drain of a transistor which constitutes an analog circuit section via a path of a resistor RSUB (it is assumed that the substrate is a conductive body having the resistor RSUB)—capacitor C1 (it is assumed that the PN junction between the substrate and the well region is a dielectric body)—resistor RWELL (it is assumed that the well region is a conductive body having the resistor RWELL)—capacitor C2 (it is assumed that the PN junction between the well region and the drain of the transistor is a dielectric body) and is thus introduced into the analog circuit.

SUMMARY OF THE INVENTION

A first object of this invention is to provide a semiconductor integrated circuit device capable of solving a problem that noises generated in the digital circuit section are introduced into the analog circuit via the power source wiring, interrupting noises generated in the digital circuit section, and sufficiently preventing the mutual interference between the digital circuit and the analog circuit.

A second object of this invention is to provide a semiconductor integrated circuit device capable of attaining the first object and at the same time enhancing the electrostatic withstanding voltage.

A third object of this invention is to provide a semiconductor integrated circuit device capable of attaining the second object and at the same time simplifying the adjustment of the circuit characteristics and the manufacturing process thereof.

A fourth object of this invention is to provide a semiconductor integrated circuit device capable of attaining the second object and at the same time more effectively preventing transmission of noises in the substrate.

In this invention, in order to attain the first object, first and second well regions of a second conductivity type are formed in a semiconductor body of a first conductivity type, an analog circuit is arranged in the first well region, a digital circuit is arranged in the second well region, and the bias potential of the semiconductor body is derived from a power source other than a power source for the digital circuit.

In this invention, in order to attain the second object, a first protection element connected between the power source for the analog circuit and the power source for the bias potential is provided and a second protection element connected between the power source for the digital circuit and the power source for the bias potential is provided.

In this invention, in order to attain the third object, a first well region of the second conductivity type which is deep and a second well region of the second conductivity type which is deep are formed in the semiconductor body of the first conductivity body. Further, a third well region of the second conductivity type which is shallow is formed in the first well region, a fourth well region of the second conductivity type which is shallow is formed in the second well region, an analog circuit is arranged in the third well region, a digital circuit is arranged in the fourth well region, and the bias potential of the semiconductor body is derived from a power source other than the power source of the digital circuit.

In this invention, in order to attain the fourth object, first and second well regions of a second conductivity type are formed in a semiconductor body of a first conductivity type, an analog circuit is arranged in the first well region, a digital circuit is arranged in the second well region, and the bias potential of the semiconductor body is derived from a power source other than a power source for the digital circuit. Further, a first high impurity concentration region surrounding the first well region is formed in the semiconductor body, and a second high impurity concentration region is formed along the junction between the first well region and the semiconductor body in the first well region. Bias potentials are applied to the respective first and second high impurity concentration regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view of a semiconductor integrated circuit device according to a first embodiment of this invention;

FIG. 2 is a block diagram of a semiconductor integrated circuit which has an analog circuit and a digital circuit integrated in one chip and to which this invention can be applied;

FIG. 3 is a construction diagram of an analog/digital converter shown in FIG. 2;

FIG. 8 is a cross sectional view indicating the noise transmission path in the device shown in FIG. 7;

FIG. 12 is a schematic cross sectional view of a semiconductor integrated circuit device according to a sixth embodiment of this invention;

FIG. 13 is a diagram showing an example of a protection element shown in FIG. 12;

FIG. 14 is a diagram showing another example of the protection element shown in FIG. 12;

DETAILED DESCRIPTION OF THE PREFERRED EMBODIMENTS

Figure 4:
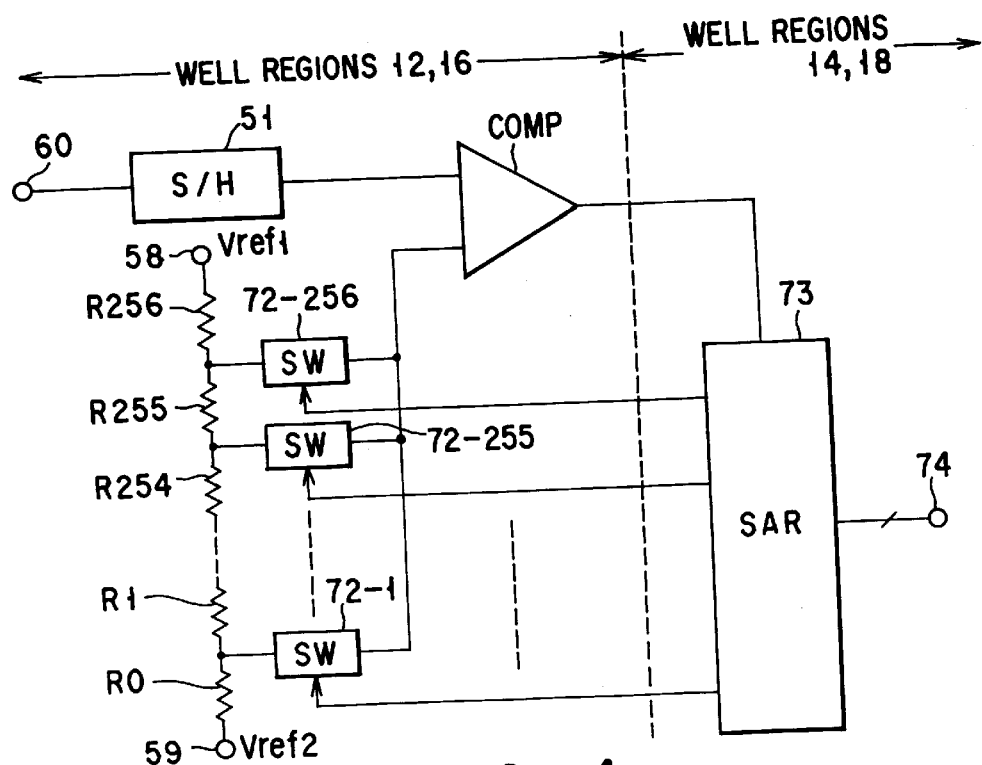
FIG. 4 is another construction diagram of an analog/digital converter shown in FIG. 2.

There will now be described an embodiment of this invention with reference to the accompanying drawings. In this explanation, like portions are denoted by the same reference numerals throughout the drawings and the repetitive explanation is omitted.

FIG. 1 is a cross sectional view of a semiconductor integrated circuit device according to a first embodiment of this invention. In the semiconductor integrated circuit device, an analog circuit and a digital circuit are integrated in one silicon substrate.

In a P-type silicon substrate 10, first and second N-type well regions 12 and 14 are separately formed. An analog circuit is formed in the first N-type well region 12 and a digital circuit is formed in the second N-type well region 14. A P-type well region 16 is formed in the first N-type well region 12, a P-type well region 18 is formed in the second N-type well region 14, and the digital circuit section and the analog circuit section can be combined to constitute a CMOS circuit.

In the N-type well regions 12 and 14, P-type semiconductor regions 20-1 to 20-4 are formed. In the P-type well regions 16 and 18, N-type semiconductor regions 22-1 to 22-4 are formed. The regions 20-1 to 20-4 and 22-1 to 22-4 are used to form active elements, and in FIG. 1, MOSFETs T1 to T4 are shown as examples of the active elements. That is, a gate insulation film 21-1 is formed on a region between the semiconductor regions 20-1 and 20-2 and a gate electrode G1 is formed on the gate insulation film 21-1 so as to construct the MOSFET T1. A gate insulation film 21-2 is formed on a region between the semiconductor regions 20-3 and 20-4 and a gate electrode G2 is formed on the gate insulation film 21-2 so as to construct the MOSFET T2. A gate insulation film 23-1 is formed on a region between the semiconductor regions 22-1 and 22-2 and a gate electrode G3 is formed on the gate insulation film 23-1 so as to construct the MOSFET T3. Further, a gate insulation film 23-2 is formed on a region between the semiconductor regions 22-3 and 22-4 and a gate electrode G4 is formed on the gate insulation film 23-2 so as to construct the MOSFET T4.

Further, N-type high impurity concentration semiconductor regions 24-1 to 24-4 having higher impurity concentration than the N-type well regions 12 and 14 in the well regions 12, 14, respectively. The regions 24-1 to 24-4 are used to apply bias potentials to the well regions 12, 14. Likewise, P-type high impurity concentration semiconductor regions 26-1, 26-2 for applying bias potentials are formed in the P-type well regions 16, 18. In the surface area of the substrate 10 between the first and second N-type well regions 12 and 14, a P-type high impurity concentration semiconductor region 28 having higher impurity concentration than the substrate 10 is formed in a portion separated from the regions 12, 14. The region 28 is used to apply a bias potential to the substrate 10.

An insulation film 30 is formed on the main surface of the substrate 10 and contact holes are formed in those portions of the insulation film 30 which lie on the semiconductor regions 22-1, 22-2, 26-1, 24-1, 20-1, 20-2, 24-2, 28, 24-3, 20-3, 20-4, 24-4, 26-2, 22-3, 22-4. Conductive layers 32-1 to 32-15 formed of aluminum layer or the like and functioning as wirings and electrodes are formed on the insulation film 30 and in the above contact holes. The conductive layers 32-2, 32-3 are connected to a first ground terminal GND1 via a wiring 40A, the conductive layers 32-4, 32-6, 32-7 are connected to a first power source terminal Vcc1 via a wiring 42A, the conductive layer 32-8 is connected to a second ground terminal GND2 via a wiring 40B. The conductive layers 32-9, 32-11, 32-12 are connected to a second power source terminal Vcc2 via a wiring 42B, and the conductive layers 32-13, 32-14 are connected to a third ground terminal GND3 via a wiring 40C. The first to third ground terminals GND1 to GND3 and the first and second power source terminals Vcc1, Vcc2 are respectively used as different lead terminals. Further, the conductive layers 32-1, 32-5, 32-10, 32-15 whose connection states are not shown are connected to attain desired circuit functions.

In the integrated circuit device with the above construction, since the substrate potential is not derived from the digital circuit section but is derived from the different independent ground terminal GND2, introduction of noise into the substrate 10 via the ground wiring can be prevented. As a result, noise can be more stably interrupted and the mutual interference between the digital circuit and the analog circuit can be sufficiently suppressed.

FIG. 2 is a block diagram of a semiconductor integrated circuit which has an analog circuit and a digital circuit integrated in one chip and to which this invention can be applied. The circuit is constructed by forming a sample/hold circuit (S/H) 51, analog/digital converter (ADC) 52, logic circuit 53 and digital/analog converter (DAC) 54 in one chip 55.

The converter 52 is supplied with reference potentials Vref1, Vref2 applied to the terminals 56, 57 as operation potentials. The converter 54 is supplied with reference potentials Vref3, Vref4 applied to the terminals 58, 59 as operation potentials. An analog input signal Ain input to an input terminal 60 is supplied to the sample/hold circuit 51 and sampled and held therein. Data (analog input signal Ain) held in the sample/hold circuit 51 is supplied to the analog/digital converter 52 and converted into digital data corresponding to the analog input signal Ain. Digital data output from the converter 52 is supplied to the logic circuit 53. The logic circuit 53 is supplied with a digital input signal Din used for effecting the logic operation from an input terminal 61 and uses the signal Din and a digital signal output from the converter 52 to effect the predetermined logic operation. The result of operation is output from an output terminal 62 as a digital output signal Dout. Alternatively, the result of operation is supplied to the digital/analog converter 54 and converted into analog data. Analog data output from the converter 54 is output from an output terminal 63 as an analog output signal Aout. Further, it is possible to effect the preset operation in the logic circuit 53 for the digital input signal Din supplied to the logic circuit 53 from the input terminal 61 instead of using an output of the converter 52, convert the same into an analog signal and output the analog signal as an analog output signal Aout from the output terminals 63.

With the above construction, the analog circuit section, that is, the sample/hold circuit 51, part of the analog/digital converter 52 and part of the digital/analog converter 54 are formed in the well regions 12, 16 shown in FIG. 1. The digital circuit section, that is, the remaining part of the analog/digital converter 52, the remaining part of the digital/analog converter 54 and logic circuit 53 are formed in the well regions 14, 18. Further, the potential (ground potential) of the substrate 10 is derived from a ground potential independent from the ground terminal of the digital circuit section.

FIG. 3 is a diagram showing an example of the construction of the analog/digital converter (ADC) 52 in the circuit of FIG. 2 and shows the circuit construction of a so-called Flash ADC. The ADC includes resistors R0 to R256, comparators COMP1 to COMP256, latch circuits LA1 to LA256, decoder 64, and inverters 65, 66. The resistors R0 to R256 are series-connected between the terminals 56 and 57 to which the reference potentials Vref1 and Vref2 are applied. One-side input terminals of the comparators COMP1 to COMP256 are respectively connected to a node between the resistors R0 and R1, - - - , a node between the resistors R253 and R254, a node between the resistors R254 and R255, and a node between the resistors R255 and R256. The other input terminals of the comparators COMP1 to COMP256 are connected to an input terminal 67 (output terminal of the sample/hold circuit 51). Output terminals of the comparators COMP1 to COMP256 are respectively connected to input terminals of the latch circuits LA1 to LA256. The comparators COMP1 to COMP256 and latch circuits LA1 to LA256 are supplied with a clock signal via inverters 65 and 66 and are synchronously operated. Output terminals of the latch circuits LA1 to LA256 are connected to input terminals of the decoders 64. 8-bit digital data is output from an output terminal 68 of the decoder 64.

The resistors R0 to R256, comparators COMP1 to COMP256 and latch circuits LA1 to LA256 are formed in the N-type well region 12 and P-type well region 16. The decoder 64 and inverters 65, 66 are formed in the N-type well region 14 and P-type well region 18.

Next, the operation is explained. An analog input supplied to the input terminal 67 is compared with potentials derived by dividing the potential difference between the reference potentials Vref1 and Vref2 by means of the comparators COMP1 to COMP256. The results of comparison by the comparators COMP1 to COMP256 are supplied to and latched in the latch circuits LA1 to LA256. Latch outputs of the latch circuits LA1 to LA256 are decoded by the decoder 64, converted into 8-bit digital data and output from the output terminal 68.

In the operation state of the decoder 64, for example, eight bits of the digital output are all set to a "1" level, and even if noise occurs in the power source line, the noise is absorbed into the semiconductor substrate 10 and will not influence the analog circuit formed in the well regions 14, 18. Likewise, noise generated from the analog circuit section is also absorbed by the semiconductor substrate 10 and will not influence the digital circuit section. Further, since the substrate potential (ground potential) is derived from the ground terminal independent from the ground potential of the digital circuit section, introduction of noise via the power source wiring can be prevented.

FIG. 4 is another construction diagram of the analog/digital converter 52 shown in FIG. 2 and shows the circuit construction of a successive approximation type ADC. The ADC includes resistors R0 to R256, switches (SW) 71-1 to 71-256, comparator COMP, and successive approximation register/control circuit (SAR) 73. The resistors R0 to R256 are series-connected between the terminals 58 and 59 to which the reference potentials Vref1 and Vref2 are applied. A node between the resistors R0 and R1 is connected to one end of the switch 71-1, - - - , a node between the resistors R254 and R255 is connected to one end of the switch 71-255, and a node between the resistors R255 and R256 is connected to one end of the switch 71-256. The other ends of the switches 71-1 to 71-256 are connected to one input terminal of the comparator COMP. The conduction states of the switches 71-1 to 71-256 are selectively controlled by an output signal of the control circuit 73. The other input terminal of the comparator COMP is connected to an output terminal of the sample/hold circuit 51. An output terminal of the comparator COMP is connected to a control input terminal of the control circuit 73 and a digital signal corresponding to the analog input signal Ain is output from the output terminal 74 of the circuit 73.

In the ADC of FIG. 4, an analog input signal held in the sample/hold circuit 51 is compared with a potential at one end of one of the switches 72-1 to 72-256 which is selected and set in the ON state by the comparator COMP. The comparing operation is sequentially effected while changing the ON/OFF states of the switches by the control circuit 73 and an 8-bit digital signal is derived from the output terminal 74 of the control circuit 73 according to the result of comparison.

Figure 5:
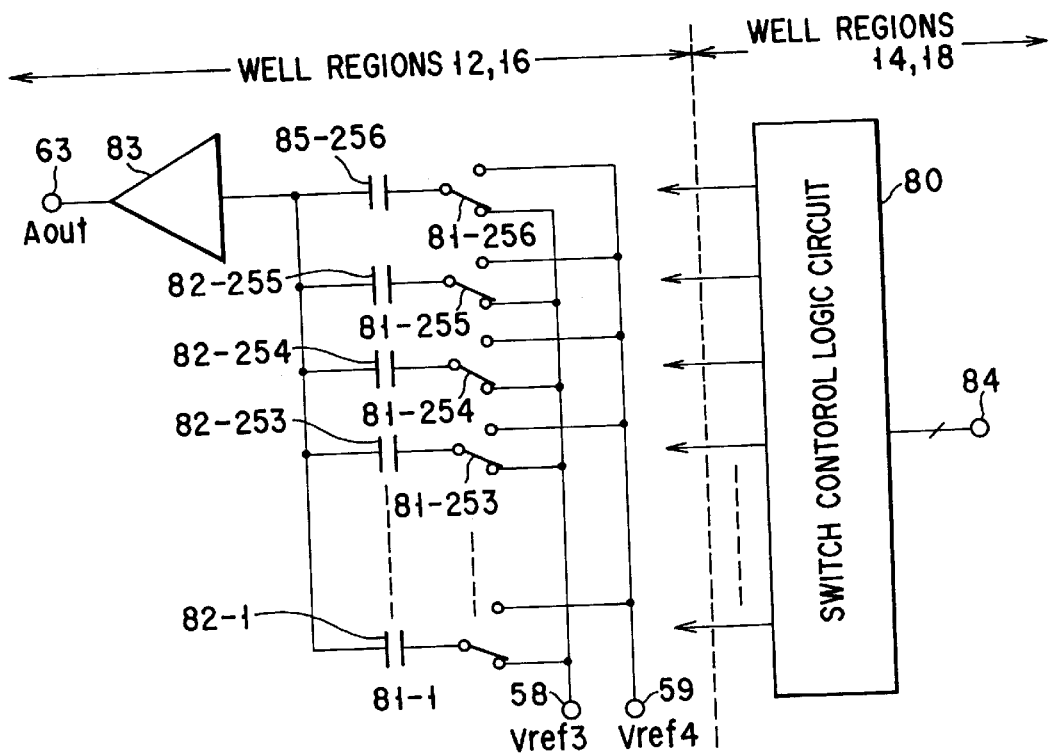
FIG. 5 is a construction diagram of a digital/analog converter shown in FIG. 2.

FIG. 5 is a construction diagram of a digital/analog converter (DAC) 54 shown in the circuit of FIG. 2. The DAC includes a switch control logic circuit 80, selection switches 81-1 to 81-256, capacitors 82-1 to 82-256, and buffer circuit 83. An input terminal 84 of the switch control logic circuit 80 is supplied with an 8-bit digital signal. The switching positions of the selection switches 81-1 to 81-256 are controlled by an output signal of the circuit 80. The selection switches 81-1 to 81-256 permit a reference potential Vref3 applied to the terminal 58 or reference potential Vref4 applied to the terminal 59 to be selectively applied to one-side electrodes of the capacitors 82-1 to 82-256. The other electrodes of the capacitors 82-1 to 82-256 are connected to an input terminal of a buffer circuit 83. An output terminal of the buffer circuit 83 is connected to an output terminal 63 for outputting an analog output signal Aout.

The switches 81-1 to 81-256, capacitors 82-1 to 82-256 and buffer circuit 83 are formed in the N-type well region 14 and P-type well region 18. The switch control logic circuit 80 is formed in the N-type well region 12 and P-type well region 16. The potential of the substrate 10 is derived from a ground terminal which is different from the ground terminal of the digital circuit section.

With the above construction, when an 8-bit digital signal is supplied to the input terminal 84, the switching positions of the selection switches 81-1 to 81-256 are set by the switch control logic circuit 80, and as a result, the charging and discharging operations for the capacitors 82-1 to 82-256 are effected to determine the potentials of the other electrodes of the capacitors 82-1 to 82-256. Then, an analog output signal Aout corresponding to an input digital signal is output from the buffer circuit 82.

Figure 6:
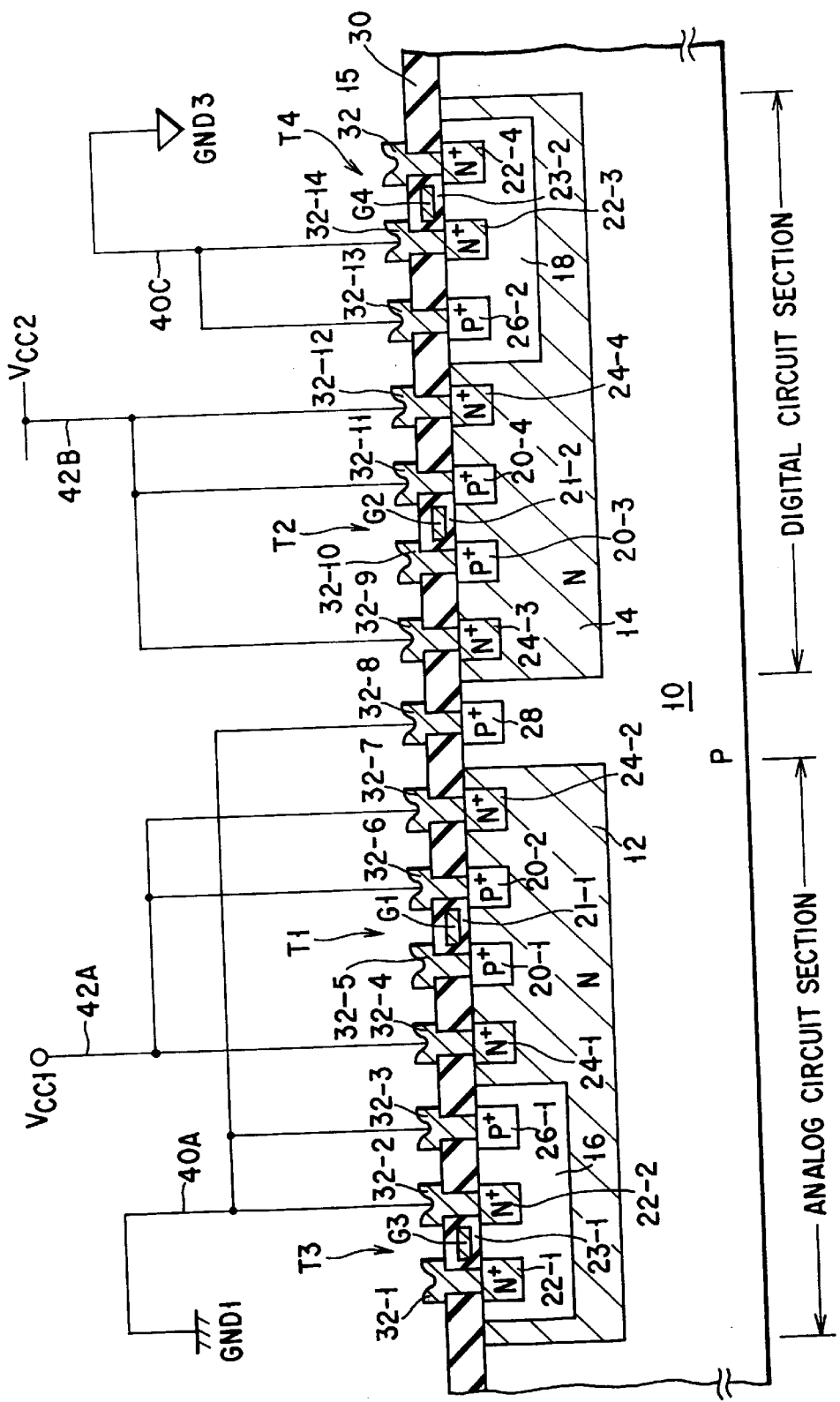
FIG. 6 is a cross sectional view of a semiconductor integrated circuit device according to a second embodiment of this invention.

FIG. 6 is a cross sectional view of a semiconductor integrated circuit device according to a second embodiment of this invention.

As shown in FIG. 6, the substrate potential is derived by laying out a wiring 40 from the power source of the analog circuit section.

With the above construction, since the wiring for applying the substrate potential is independent from the digital circuit section, introduction of noise occurring in the digital circuit section into the substrate via the ground wiring can be prevented. Therefore, the mutual interference between the digital circuit section and the analog circuit section can be prevented.

Figure 7:
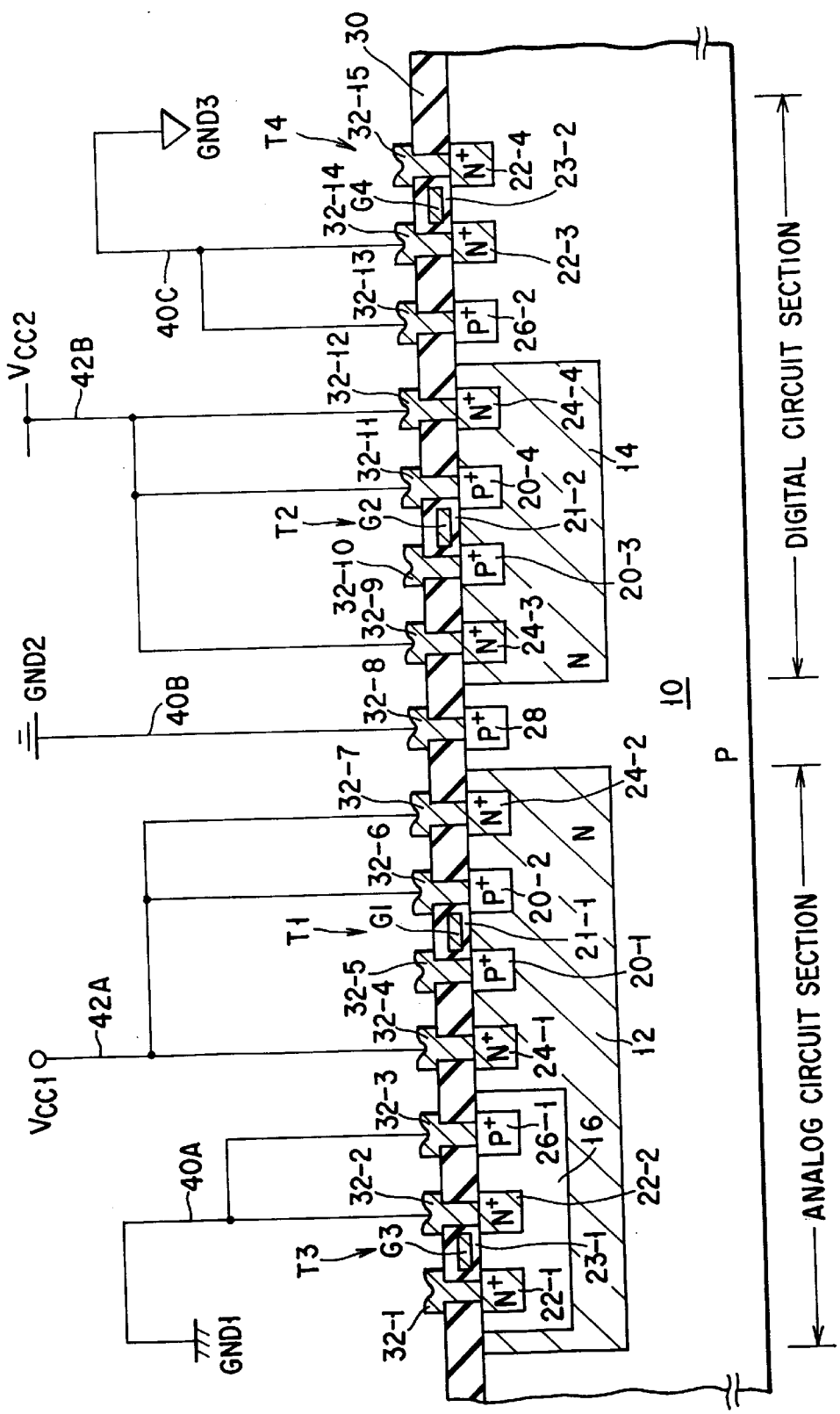
FIG. 7 is a cross sectional view of a semiconductor integrated circuit device according to a third embodiment of this invention.

FIG. 7 is a cross sectional view of a semiconductor integrated circuit device according to a third embodiment of this invention.

As shown in FIG. 7, an N-channel MOSFET T4 constituting the digital circuit section is formed in the substrate 10. The substrate 10 is connected to a power source terminal GND2 independent from the digital circuit section. Further, the substrate 10 is connected to a power source terminal GND3 of the digital circuit section via a semiconductor region 26-2 in an area near the MOSFET T4.

FIG. 8 is a cross sectional view indicating the noise transmission path in the device shown in FIG. 7.

As shown in FIG. 8, noise occurring in a wiring 40C is transmitted into the substrate 10 via a semiconductor region 26-2, applied to the drain (20-1) of a P-channel transistor T1 constituting the analog circuit section via a path of a resistor RSUB (it is assumed that the substrate 10 is a conductive body having the resistor RSUB)—capacitor C1 (it is assumed that the PN junction between the substrate 10 and the well region 12 is a dielectric body)—resistor RWELL (it is assumed that the well region 12 is a conductive body having the resistor RWELL)—capacitor C2 (it is assumed that the PN junction between the well region 12 and the semiconductor region 20-1 is a dielectric body), and then introduced into the analog circuit via a conductive layer 32-5. However, the resistance of the resistor RSUB is larger than that of the wiring formed of aluminum in the above embodiment.

Further, in the above embodiment, a well region 14 is disposed between the semiconductor region 26-2 and the well region 12 to increase the distance from the semiconductor region 26-2 to the analog circuit section. Therefore, noise in the substrate 10 is reduced and noise is prevented from reaching the well region 12. As a result, the mutual interference between the digital circuit and the analog circuit can be prevented more effectively than in the integrated circuit device disclosed in Japanese Patent Application No. H.3-1232.

Further, in the third embodiment, the substrate 10 is connected to the power source terminal GND2 independent from the digital circuit section. With this construction, small noise in the substrate 10 can be absorbed into the power source terminal GND2, thereby making it possible to further suppress the mutual interference between the digital circuit and the analog circuit.

Figure 9:
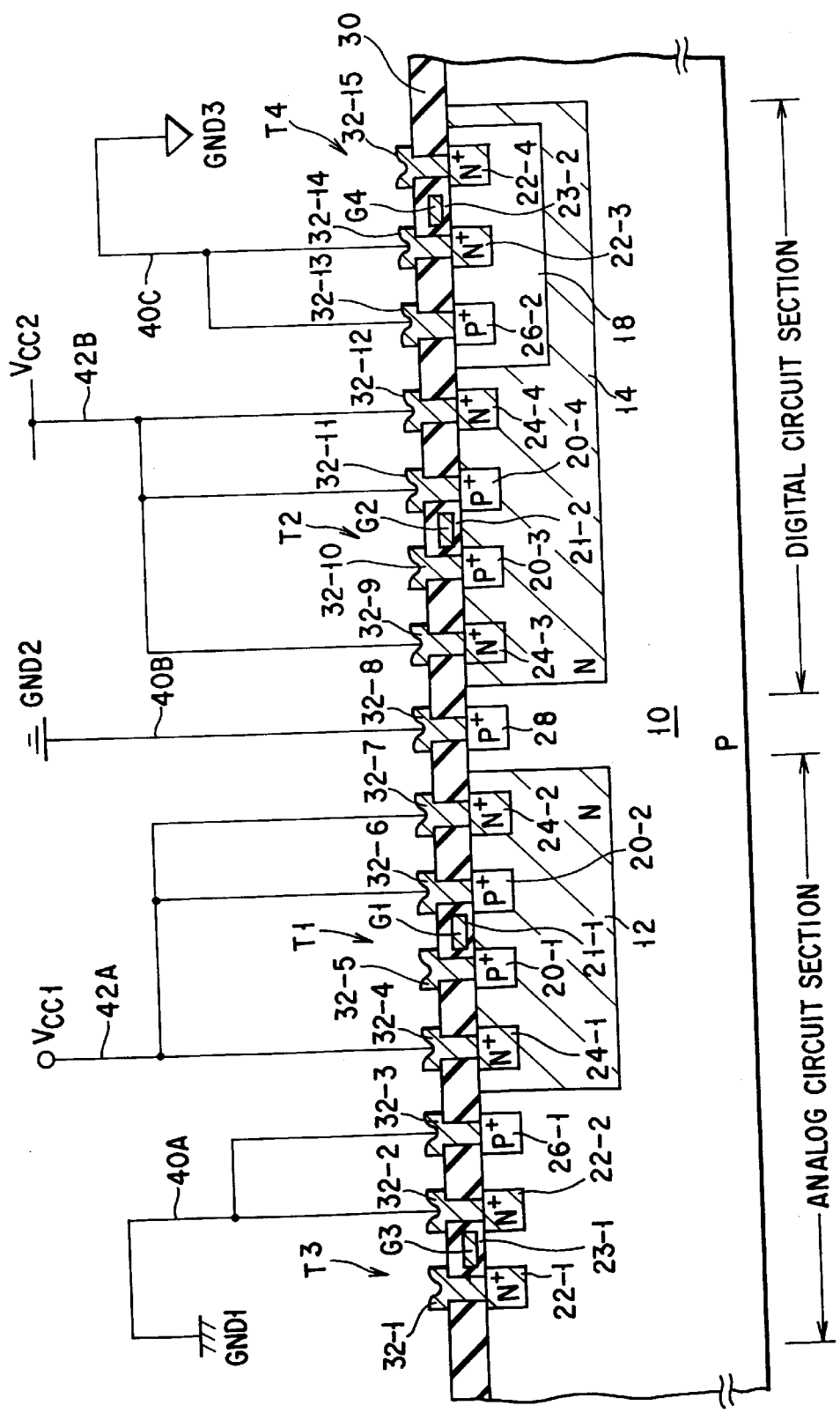
FIG. 9 is a cross sectional view of a semiconductor integrated circuit device according to a fourth embodiment of this invention.

FIG. 9 is a cross sectional view of a semiconductor integrated circuit device according to a fourth embodiment of this invention.

As shown in FIG. 9, an N-channel MOSFET T3 constituting the analog circuit section is formed in the substrate 10. The substrate 10 is connected to a power source terminal GND2 independent from the digital circuit section. Further, the substrate 10 is connected to a power source terminal GND1 of the analog circuit section via a semiconductor 26-1 in an area near the MOSFET T3.

With the above construction, the same operation as that of the third embodiment can be attained and the mutual interference between the digital circuit and the analog circuit can be prevented.

Figure 10:
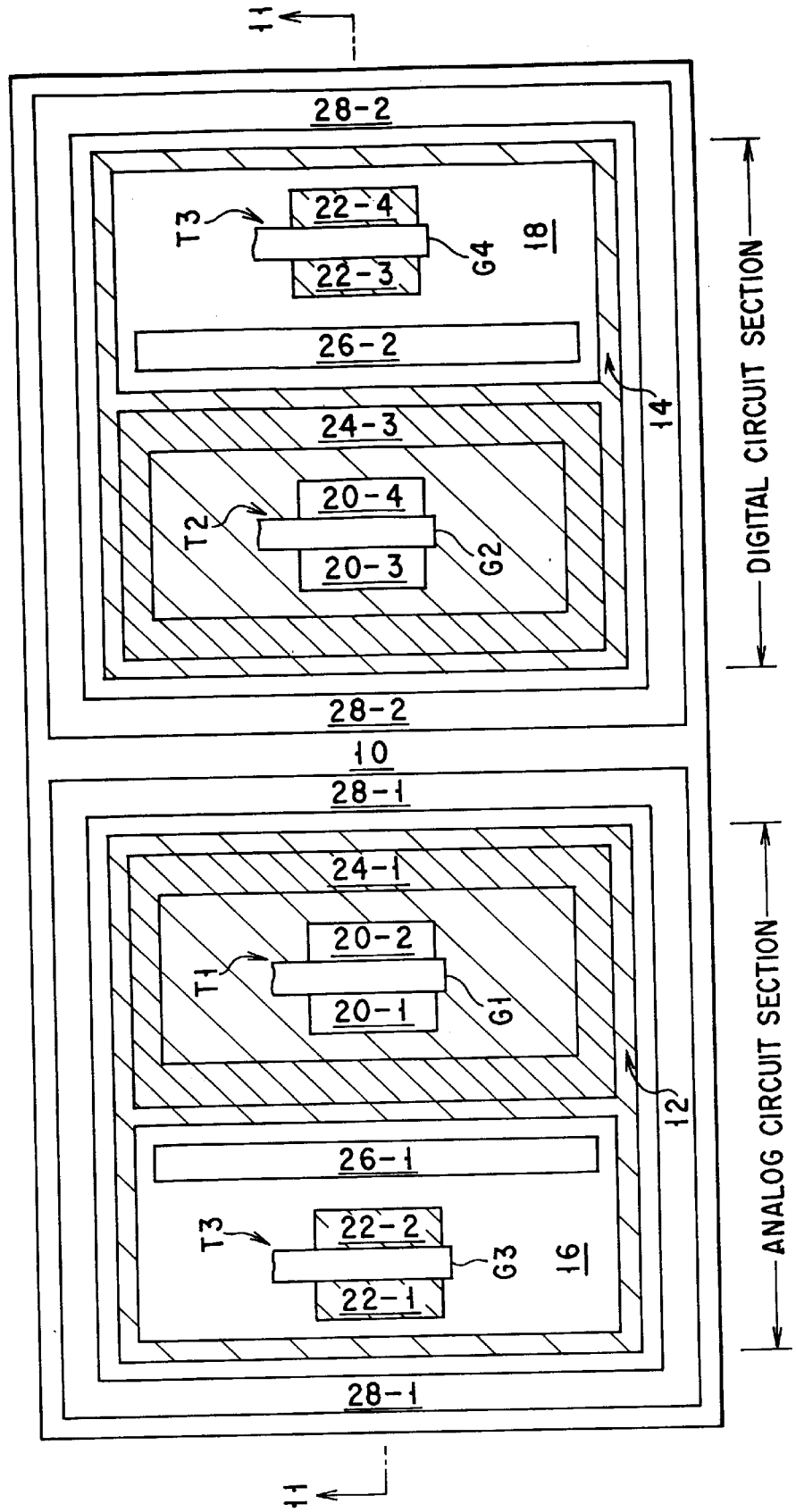
FIG. 10 is a pattern plan view of a semiconductor integrated circuit device according to a fifth embodiment of this invention.
Figure 11:
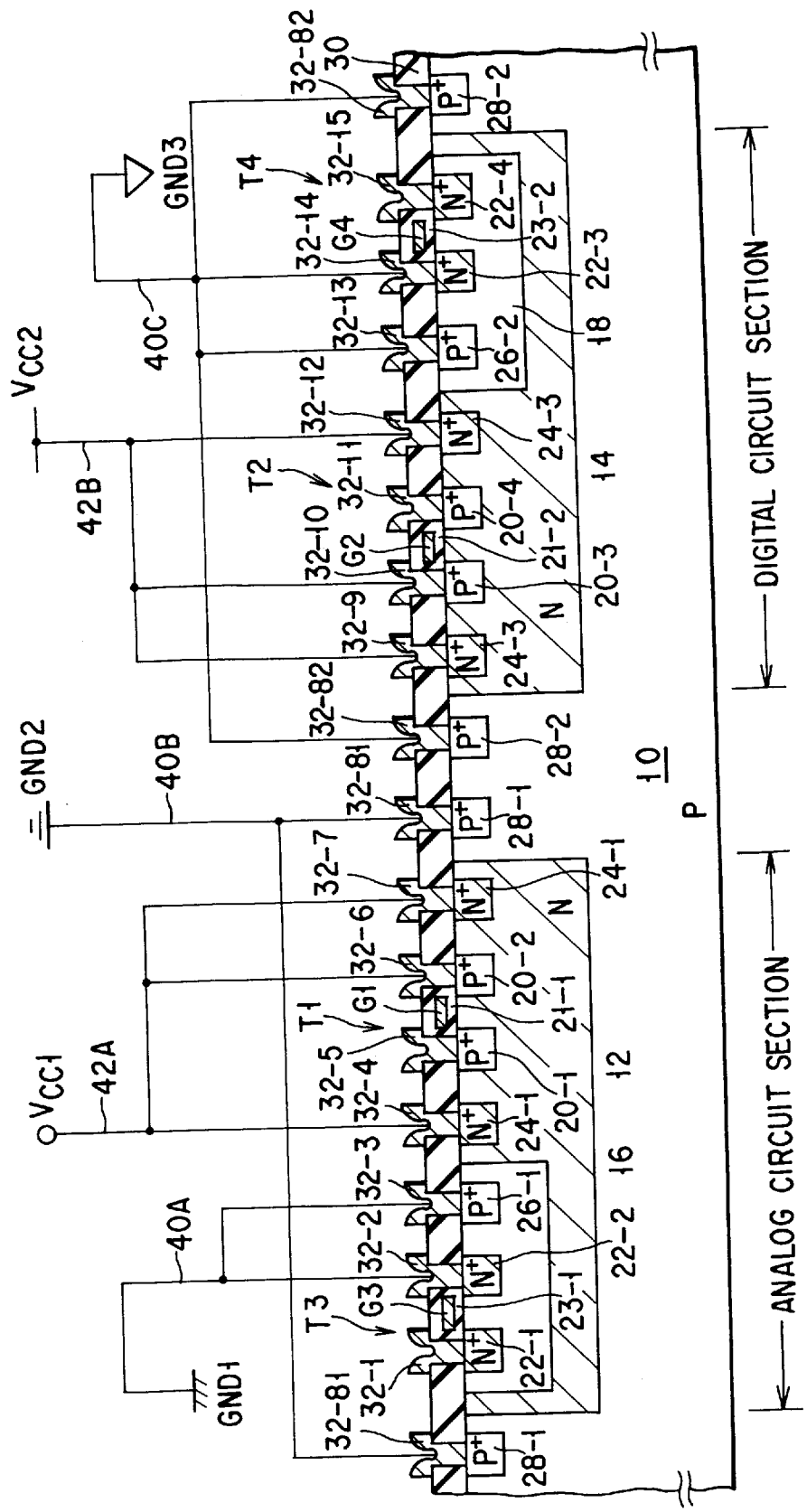
FIG. 11 is a cross sectional view taken along the line 11—11 in FIG. 10.

FIG. 10 is a pattern plan view of a semiconductor integrated circuit device according to a fifth embodiment of this invention and FIG. 11 is a cross sectional view taken along the line 11—11 in FIG. 10.

As shown in FIGS. 10 and 11, the peripheral portion of the analog circuit section is surrounded by a P-type high impurity concentration semiconductor region 28-1 and the peripheral portion of the digital circuit section is surrounded by a P-type high impurity concentration semiconductor region 28-2. In the analog circuit section, an N-type well region 12 is formed and a P-channel MOSFET Ti is formed in the well region 12. The peripheral portion of the MOSFET T1 is surrounded by an N-type high impurity concentration semiconductor region 24-1 which is formed in the well region 12. Further, a P-type well region 16 is formed in the well region 12 and an N-channel MOSFET T3 is formed in the well region 16. A P-type high impurity concentration semiconductor region 26-1 is formed in the well region 16 between the MOSFETs T3 and T1. An N-type well region 14 is formed in the digital circuit section and a P-channel MOSFET T2 is formed in the well region 14. The peripheral portion of the MOSFET T2 is surrounded by an N-type high impurity concentration semiconductor region 24-3 formed in the well region 14. A P-type well region 18 is formed in the well region 14 and an N-channel MOSFET T4 is formed in the well region 18. A P-type high impurity concentration semiconductor region 26-2 is formed in the well region 16 between the MOSFETs T4 and T2. A P-type high impurity concentration semiconductor region 28-1 is electrically connected to the power source terminal GND2 and a P-type high impurity concentration semiconductor region 28-2 is electrically connected to the power source terminal GND3.

With the above construction, like the first to fourth embodiments, noise can be stably interrupted and the mutual interference between the digital circuit and the analog circuit can be sufficiently prevented.

Next, a semiconductor integrated circuit device according to a sixth embodiment of this invention is explained.

FIG. 12 is a cross sectional view schematically showing a semiconductor integrated circuit device according to the sixth embodiment of this invention.

As shown in FIG. 12, N-type well regions 12 and 14 are formed in a P-type silicon substrate 10. In the N-type well region 12, a P-type well region 16 is formed. In the N-type well region 14, a P-type well region 18 is formed. An analog circuit 50 is formed in the N-type well region 12 and P-type well region 16 and a digital circuit 52 is formed in the N-type well region 14 and P-type well region 18.

The analog circuit 50 is driven by a potential difference between a high potential power source VDD1 and a low potential power source (for example, ground potential) VSS1 used as an operation voltage. The N-type well region 12 is biased by the power source VDD1 and the P-type well region 16 is biased by the power source VSS1. On the other hand, the digital circuit 52 is driven by a potential difference between a high potential power source VDD2 and a low potential power source (for example, ground potential) VSS2 used as an operation voltage. The N-type well region 14 is biased by the power source VDD2 and the P-type well region 18 is biased by the power source VSS2.

A protection circuit 54 for protecting the analog circuit 50 and the digital circuit 52 from surge from the power source is formed in the substrate 10 lying between the N-type well regions 12 and 14. The protection circuit 54 includes an analog circuit protection device 56 and a digital circuit protection device 58. The protection device 56 is connected between an analog high potential power source VDD1 and a substrate potential (for example, ground potential) VSS3. On the other hand, the protection device 58 is connected between a digital high potential power source VDD2 and the substrate potential (for example, ground potential) VSS3.

Next, an example of the protection device is explained.

FIG. 13 is a diagram showing a first example of the protection device.

As shown in FIG. 13, the protection device 56 is constructed by an N-channel MOSFET having a drain connected to the power source VDD1, and a source, gate and back-gate connected to the substrate potential VSS3. The MOSFET is a normally-OFF device.

Further, the protection device 58 is constructed by an N-channel MOSFET having a drain connected to the power source VDD2, and a source, gate and back-gate connected to the substrate potential VSS3. The MOSFET is also a normally-OFF device.

Next, the basic protecting operation shown in FIG. 12 is explained by referring to the protection device shown in FIG. 13.

When positive surge is input to the drain of the protection device, a positive bias is applied between the collector and base of a lateral type parasitic NPN bipolar transistor provided in the MOSFET structure. When the bias exceeds the breakdown voltage, a current is injected into the base to render the above NPN bipolar transistor conductive so as to release the positive surge into the substrate potential VSS3.

When the above phenomenon occurs in the protection device 56, the analog circuit 50 can be protected from the positive surge, and when the above phenomenon occurs in the protection device 58, the digital circuit 52 can be protected from the positive surge.

Further, when negative surge is input to the drain of the protection device, the PN junction between the drain and back-gate of the MOSFET is biased in a forward direction, thereby permitting a current to flow from the back-gate to the drain. Therefore, the potential of the back-gate is lowered and a positive potential difference occurs between the gate and the back-gate. As a result, the MOSFET is rendered conductive to release the negative surge into the substrate potential VSS3.

When the above phenomenon occurs in the protection device 56, the analog circuit 50 can be protected from the negative surge, and when the above phenomenon occurs in the protection device 58, the digital circuit 52 can be protected from the negative surge.

Large noise may be introduced into the power sources VDD2 and VSS2 of the digital circuit 52, but in the protection circuit 54 shown in FIG. 12, the protection circuit 54 is formed in the substrate 10 and the protection circuit 54 permits noise to be absorbed into the substrate potential VSS3 by the operation explained with reference to FIG. 13. Therefore, noise occurring in the digital circuit 52 will be prevented from being transmitted to the analog circuit 50 via the protection circuit 54.

As described above, in the semiconductor integrated circuit device having the above protection circuit 54 formed in the substrate 10, the electrostatic withstanding voltage can be enhanced while the mutual interference between the analog circuit and the digital circuit is kept sufficiently suppressed as in the case of first to fifth embodiments.

FIG. 14 is a diagram showing a second example of the protection device.

As shown in FIG. 14, the protection device 56 is constructed by a diode having a cathode connected to a power source VDD1 and an anode connected to a substrate potential VSS3. Further, the protection device 58 is constructed by a diode having a cathode connected to a power source VDD2 and an anode connected to the substrate potential VSS3.

Thus, like the protection circuit 54 shown in FIG. 12, the electrostatic withstanding voltage of the integrated circuit device can be enhanced while the mutual interference between the analog circuit and the digital circuit is kept sufficiently suppressed even when the MOSFET shown in FIG. 13 is replaced with a diode.

Next, a semiconductor integrated circuit device according to a seventh embodiment of this invention is explained.

Figure 15:
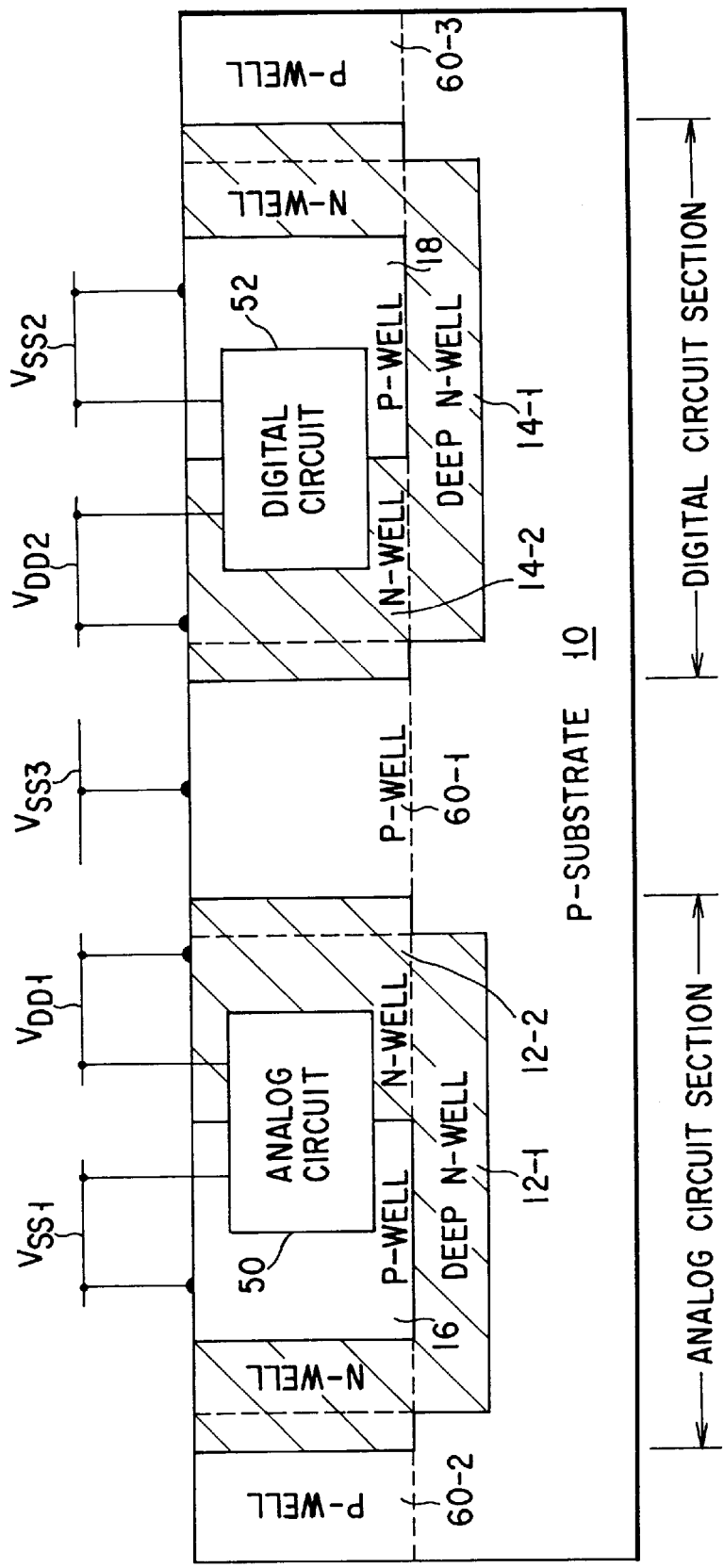
FIG. 15 is a schematic cross sectional view of a semiconductor integrated circuit device according to a seventh embodiment of this invention.

FIG. 15 is a cross sectional view schematically showing a semiconductor integrated circuit device according to the seventh embodiment of this invention.

As shown in FIG. 15, a deep N-type well region 12-1 and a deep N-type well region 14-1 are formed in a P-type silicon substrate 10. A P-type well region 16 and an N-type well region 12-2 are formed in the deep N-type well region 12-1. The impurity concentration of the N-type well region 12-2 is set to be higher than that of the deep N-type well region 12-1. In the deep N-type well region 14-1, a P-type well region 18 and an N-type well region 14-2 are formed. The impurity concentration of the N-type well region 14-2 is set to be higher than that of the deep N-type well region 14-1. An analog circuit 50 is formed in the N-type well region 12-2 and P-type well region 16, and a digital circuit 52 is formed in the N-type well region 14-2 and P-type well region 18.

The analog circuit 50 is driven by a potential difference between the power source VDD1 and the power source (for example, ground potential) VSS1 used as an operation voltage. The deep N-type well region 12-1 and the N-type well region 12-2 are biased by the power source VDD1 and the P-type well region 16 is biased by the power source VSS1. On the other hand, the digital circuit 52 is driven by a potential difference between the power source VDD2 and the power source (for example, ground potential) VSS2 used as an operation voltage. The deep N-type well region 14-1 and the N-type well region 14-2 are biased by the power source VDD2 and the P-type well region 18 is biased by the power source VSS2.

P-type well regions 60-1, 60-2, 60-3 are formed in the surface portion of the substrate 10 except the portions of the analog circuit section and digital circuit section.

As described above, in the device according to the sixth embodiment, the analog circuit and the digital circuit are separated from each other in the substrate 10 by forming the deep N-type well regions 12-1 and 14-1. The impurity concentration of the deep N-type well regions 12-1 and 14-1 is lowered so that a well region for isolating the analog circuit and the digital circuit from each other in the substrate 10 can be formed in a brief period of time. The circuit characteristic can be variously adjusted by forming N-type well regions 14-2 and 18-2 in the deep N-type well regions 12-1 and 14-1 and adjusting the impurity concentrations of the regions. That is, by forming the semiconductor integrated circuit device to have the construction shown in FIG. 15, the adjustment of the circuit characteristic and the manufacturing process thereof can be made simple.

Further, the P-type well regions 60-1, 60-2 and 60-3 are not necessarily formed, but they may be used to simplify the adjustment of the circuit characteristic as in the above case when a circuit other than the analog circuit and digital circuit, for example, the protection circuit shown in FIG. 12 or the like is formed in the substrate 10.

Next, a semiconductor integrated circuit device according to an eighth embodiment of this invention is explained.

Figure 16:
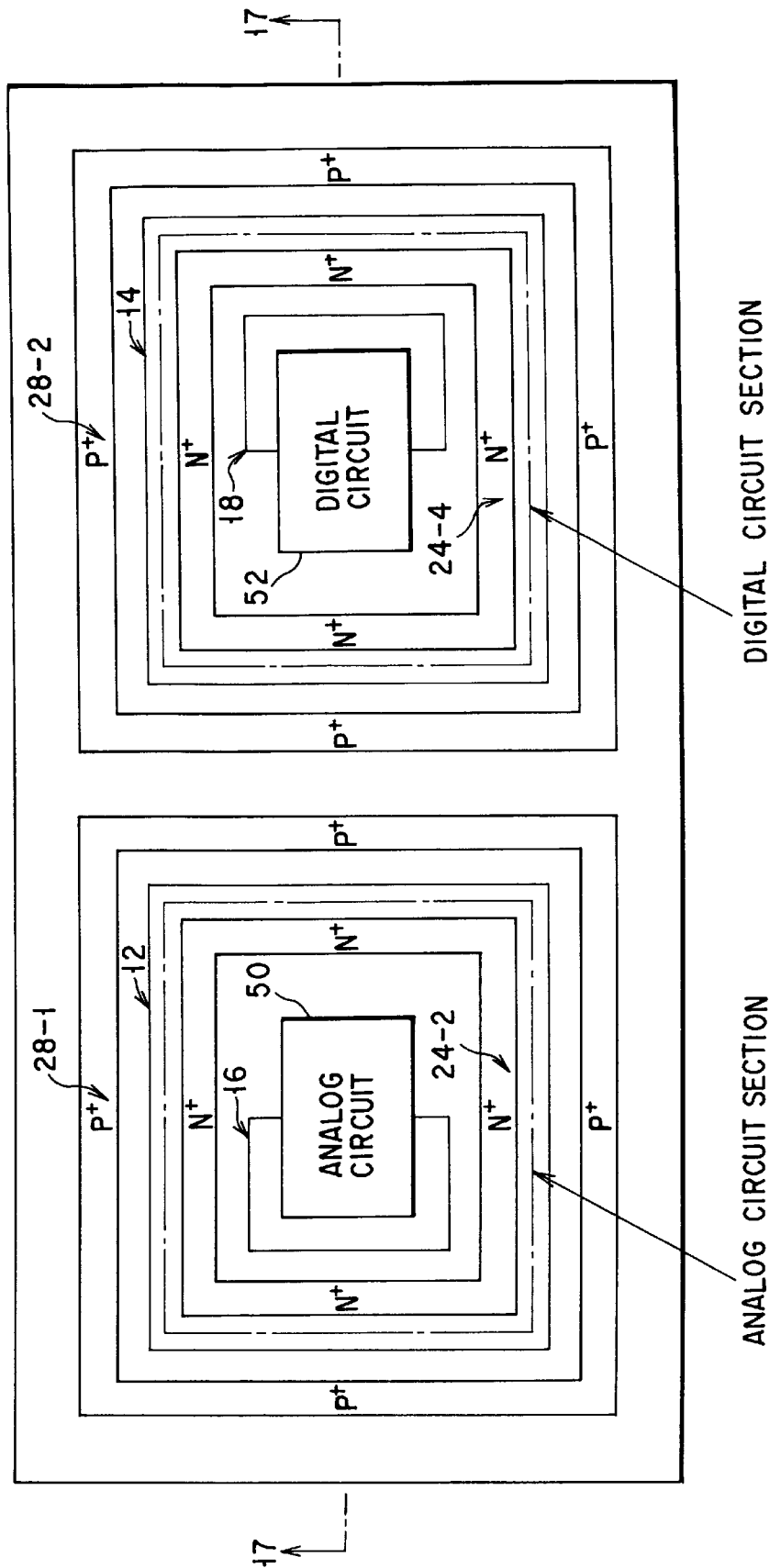
FIG. 16 is a schematic plan view of a semiconductor integrated circuit device according to an eighth embodiment of this invention.
Figure 17:
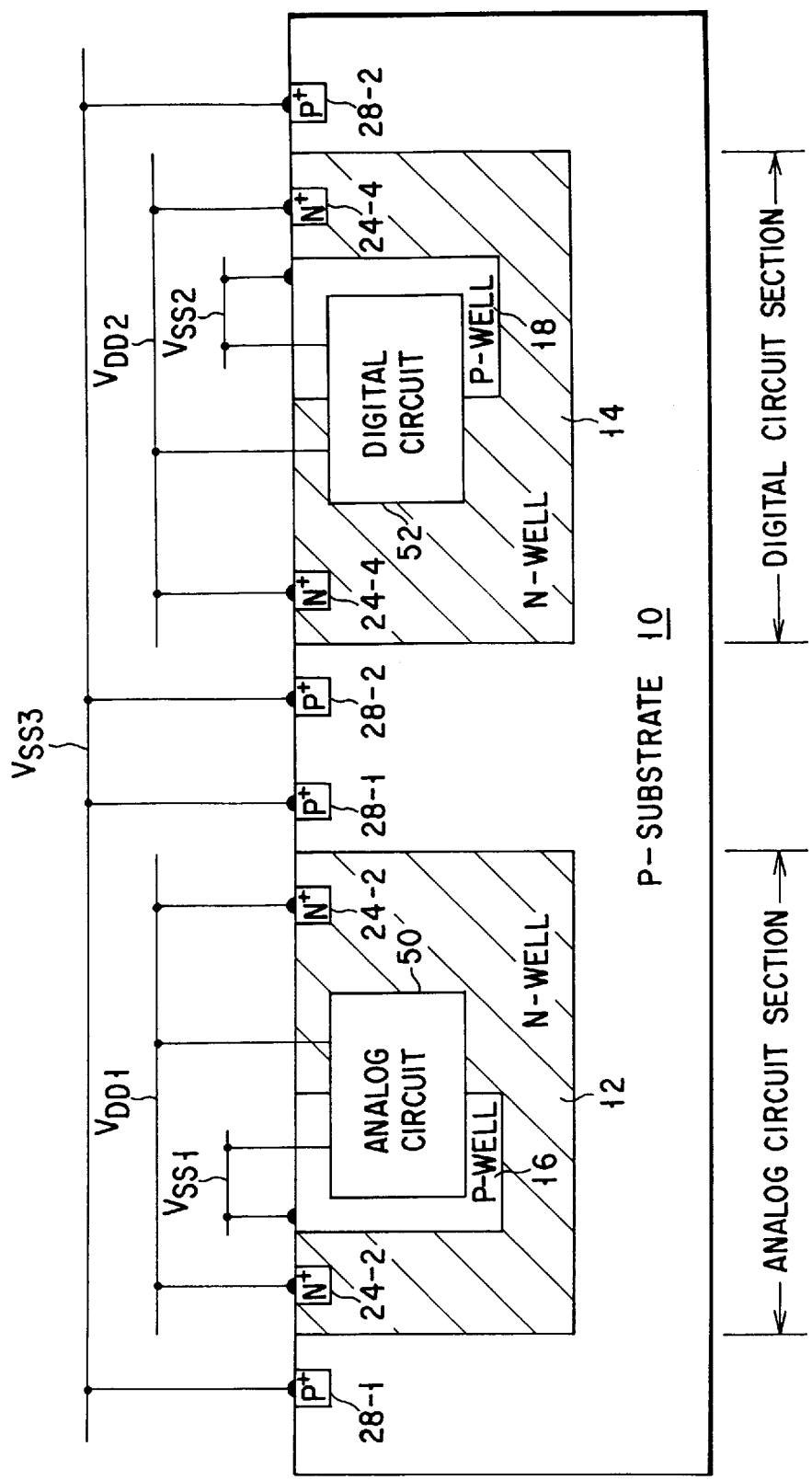
FIG. 17 is a cross sectional view taken along the line 17—17 in FIG. 16.

FIG. 16 is a schematic plan view of a semiconductor integrated circuit device according to an eighth embodiment of this invention, and FIG. 17 is a cross sectional view taken along the line 17—17 in FIG. 16.

As shown in FIGS. 16 and 17, a ring-form $P^+$-type region 28-1 which surrounds the N-type well region is formed in the surface area of the substrate 10. A wiring supplied with a substrate potential VSS3 is connected to the $P^+$-type region 28-1. An $N^+$-type region 24-2 is formed along the PN junction between the N-type well region 12 and the substrate 10 in the surface area of the N-type well region 12. A wiring supplied with a power source voltage VDD1 is connected to the $N^+$-type region 24-2. Further, a ring-form $P^+$-type region 28-2 which surrounds the N-type well region 14 is formed in the surface area of the substrate 10. A wiring supplied with the substrate potential VSS3 is connected to the $P^+$-type region 28-2. An $N^+$-type region 24-4 is formed along the PN junction between the N-type well region 14 and the substrate 10 in the surface area of the N-type well region 14. A wiring supplied with a power source voltage VDD2 is connected to the $N^+$-type region 24-4.

As described above, in the device according to the eighth embodiment, the N-type well region 12 is surrounded by the $P^+$-type region 28-1 and the $N^+$-type region 24-2 is formed along the PN junction between the N-type well region 12 and the substrate 10. That is, by intensively biasing the boundary portion between the analog circuit section and the substrate 10, leakage of noise occurring in the analog circuit or introduction of noise occurring in the digital circuit can be forcedly prevented.

Likewise, the N-type well region 14 is surrounded by the $P^+$-type region 28-2 and the $N^+$-type region 24-4 is formed along the PN junction between the N-type well region 14 and the substrate 10. That is, by intensively biasing the boundary portion between the digital circuit section and the substrate 10, leakage of noise occurring in the digital circuit or introduction of noise occurring in the analog circuit can be more forcedly prevented.

Figure 18:
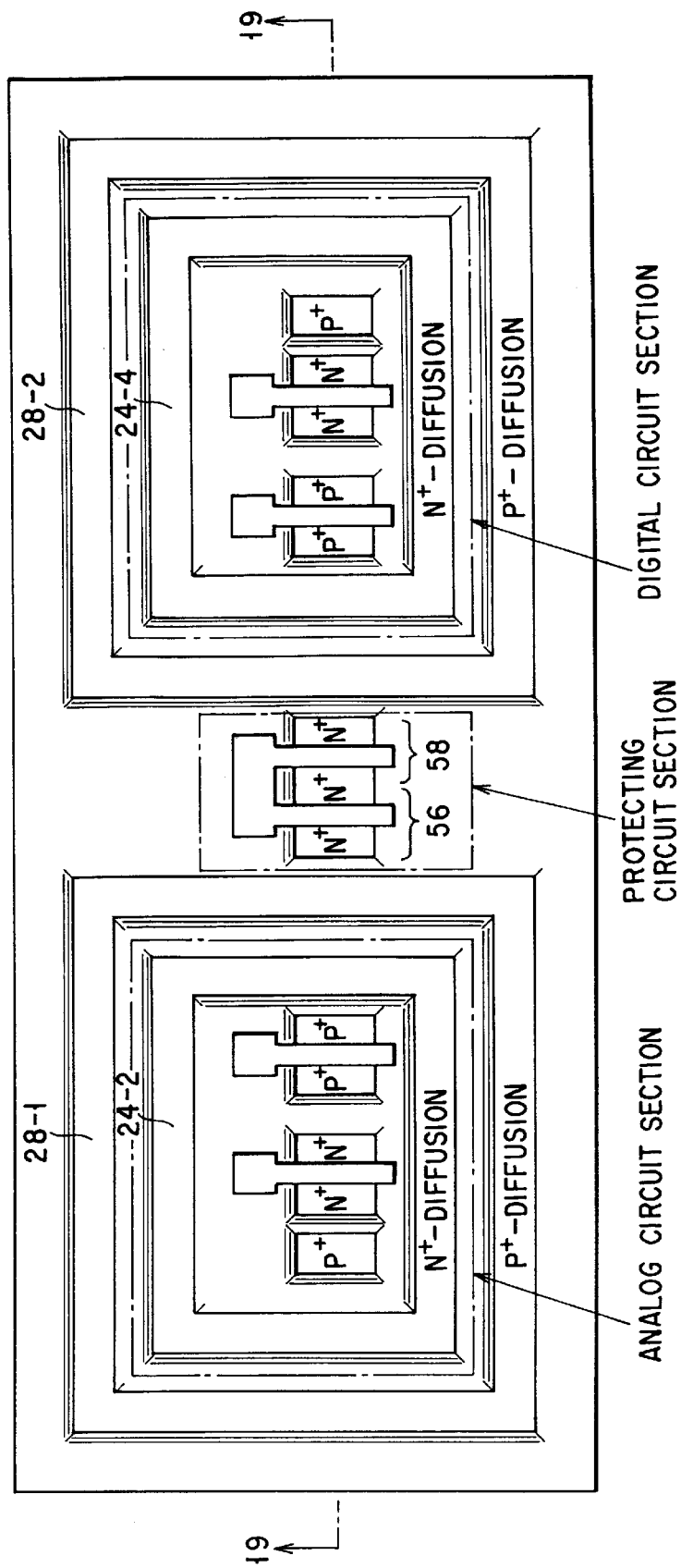
FIG. 18 is a concrete plan view of a semiconductor integrated circuit device having all of the constituents explained in the sixth to eighth embodiments.
Figure 19:
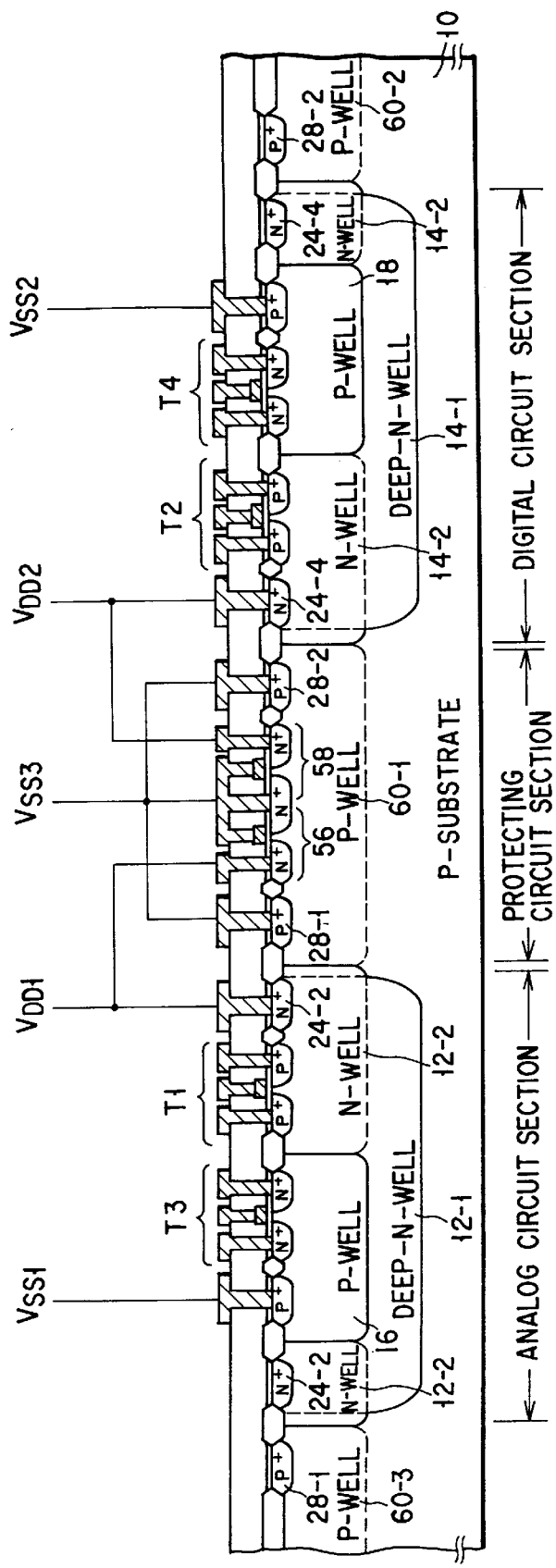
FIG. 19 is a cross sectional view taken along the line 19—19 in FIG. 18.

FIG. 18 is a concrete plan view of a semiconductor integrated circuit device having all of the constituents explained in the sixth, seventh and eighth embodiments. FIG. 19 is a cross sectional view taken along the line 19—19 in FIG. 18.

Next, a semiconductor integrated circuit device according to a ninth embodiment of this invention is explained.

Figure 20:
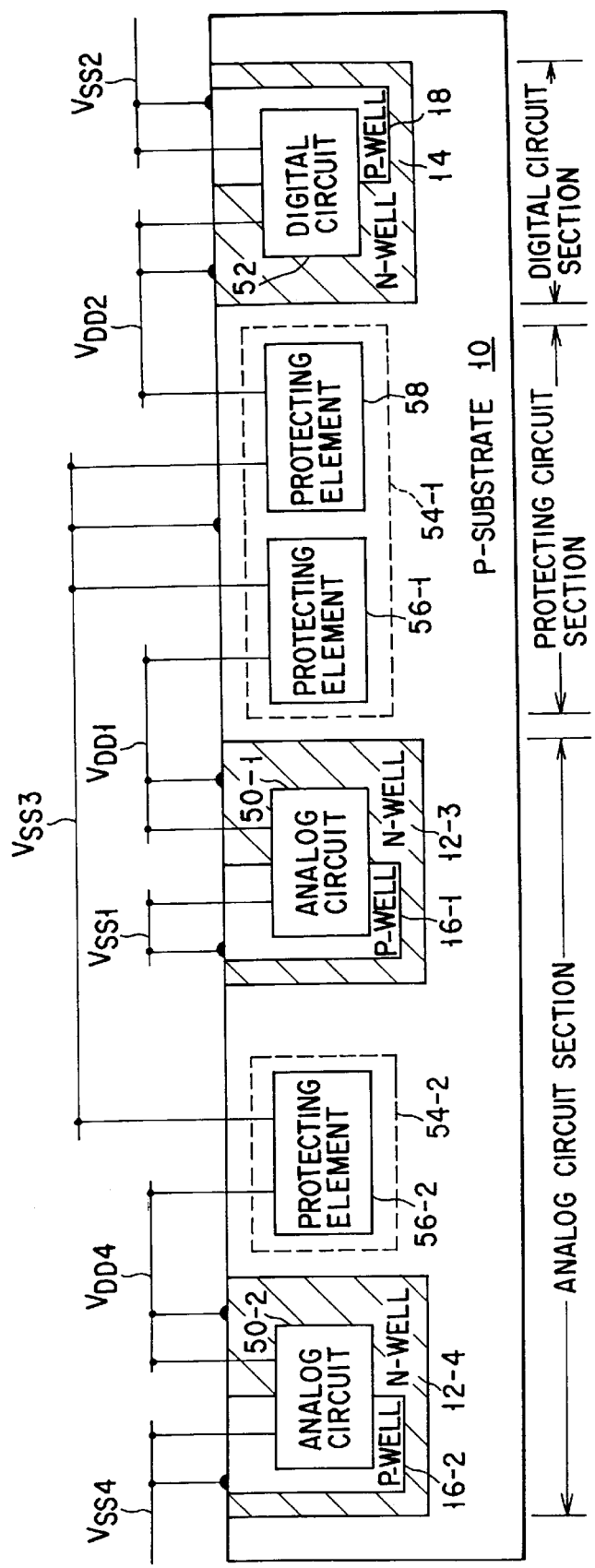
FIG. 20 is a schematic cross sectional view of a semiconductor integrated circuit device according to a ninth embodiment of this invention.

FIG. 20 is a schematic plan view of a semiconductor integrated circuit device according to a ninth embodiment of this invention.

As shown in FIG. 20, in a P-type silicon substrate 10, N-type well regions 12-3, 12-4 and 14 are formed. A P-type well region 16-1 is formed in the N-type well region 12-3 and a P-type well region 16-2 is formed in the N-type well region 12-4. Further, a P-type well region 18 is formed in the N-type well region 14. A first analog circuit 50-1 is formed in the N-type well region 12-3 and P-type well region 16-1 and a second analog circuit 50-2 is formed in the N-type well region 12-4 and P-type well region 16-2. Further, a digital circuit 52 is formed in the N-type well region 14 and P-type well region 18.

The analog circuit 50-1 is driven by a potential difference between a high potential power source VDD1 and a low potential power source (for example, ground potential) VSS1 used as an operation voltage. The N-type well region 12-3 is biased by the power source VDD1 and the P-type well region 16-1 is biased by the power source VSS1. The analog circuit 50-2 is driven by a potential difference between a high potential power source VDD4 and a low potential power source (for example, ground potential) VSS4 used as an operation voltage. The N-type well region 12-4 is biased by the power source VDD4 and the P-type well region 16-2 is biased by the power source VSS4. Further, the digital circuit 52 is driven by a potential difference between a high potential power source VDD2 and a low potential power source (for example, ground potential) VSS2 used as an operation voltage. The N-type well region 14 is biased by the power source VDD2 and the P-type well region 18 is biased by the power source VSS2.

A first protection circuit 54-1 for protecting the analog circuit 50-1 and the digital circuit 52 from surge from the power source is formed in that portion of the substrate 10 which lies between the N-type well regions 12-3 and 14. The protection circuit 54 includes an analog circuit protection device 56-1 and a digital circuit protection device 58. The protection device 56-1 is connected between the analog high potential power source VDD1 and the substrate potential (for example, ground potential) VSS3. On the other hand, the protection device 58 is connected between the digital high potential power source VDD2 and the substrate potential (for example, ground potential) VSS3.

Further, a second protection circuit 54-2 for protecting the analog circuit 50-2 from surge from the power source is formed in the substrate 10 lying between the N-type well regions 12-3 and 12-4. The protection circuit 54-2 includes an analog circuit protection device 56-2. The protection device 56-2 is connected between the analog high potential power source VDD4 and the substrate potential (for example, ground potential) VSS3.

In the device shown in FIG. 20, two N-type well regions are formed in the analog circuit section. The first analog circuit 50-1 is formed in the N-type well region 12-3 and P-type well region 16-1 and the second analog circuit 50-2 is formed in the N-type well region 12-4 and P-type well region 16-2. with this construction, not only the mutual interference between the analog circuit and the digital circuit but also the mutual interference between the analog circuits can be prevented.

Further, by forming the protection devices 56-1, 56-2 and 58 shown in FIGS. 13 and 14 in the respective well regions, electrostatic withstanding voltage thereof can be enhanced while the mutual interference between the analog circuit and the digital circuit and the mutual interference between the analog circuits are sufficiently suppressed.

Further, the ninth embodiment can be modified to prevent the mutual interference between the digital circuits by forming a plurality of N-type well regions in the digital circuit section and separately arranging the well regions for the respective digital circuits.

This invention is not limited to the above embodiments and can be variously modified. For example, the P and N conductivity types can be respectively replaced with N and P. Further, the digital circuit section may be formed as an input/output circuit section. In addition, this invention can be modified without departing from the technical scope thereof.

As described above, according to this invention, a semiconductor integrated circuit device in which noise can be stably interrupted and the mutual interference between the analog circuit and digital circuit can be sufficiently prevented can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor body of a first conductivity type;
   a first well region of a second conductivity type formed in said semiconductor body;
   a second well region of the second conductivity type formed in said semiconductor body;
   a third well region of the first conductivity type formed in said first well region;
   a fourth well region of the first conductivity type formed in said second well region;
   a digital circuit formed in said first and third well regions;
   an analog circuit formed in said second and fourth well regions;
   first bias means for biasing said first well region by a first constant potential;
   second bias means for biasing said second well region by a second constant potential;
   third bias means for biasing said third well region by a third constant potential;
   fourth bias means for biasing said fourth well region by a fourth constant potential;
   fifth bias means for biasing said semiconductor body by a fifth constant potential, said fifth bias means being independent from at least said third bias means;
   a first protection element formed in said semiconductor body and having a current path which is supplied with said first constant potential at one end thereof and supplied with said fifth constant potential at another end; and
   a second protection element formed in said semiconductor body having a current path which is supplied with said second constant potential at one end thereof and supplied with said fifth constant potential at another end.

2. A semiconductor device according to claim 1, wherein said first and second protection elements are formed in the surface area of that portion of said semiconductor body which lies between said first and second well regions.

3. A semiconductor device according to claim 2, wherein said first protection element is an insulated gate FET whose gate is connected to said fifth constant potential, and said second protection element is an insulated gate FET whose gate is connected to said fifth constant potential.

4. A semiconductor device according to claim 1, wherein:
   said first bias means includes a first semiconductor region formed in the surface area of said first well region and having an impurity concentration higher than that of said first well region, a first wiring connected to said first semiconductor region, and a first power source terminal for supplying the first constant potential to said first wiring;
   said second bias means includes a second semiconductor region formed in the surface area of said second well region and having an impurity concentration higher than that of said second well region, a second wiring connected to said second semiconductor region, and a second power source terminal for supplying the second constant potential to said second wiring;
   said third bias means includes a third semiconductor region formed in the surface area of said third well region and having an impurity concentration higher than that of said third well region, a third wiring connected to said third semiconductor region, and a third power source terminal for supplying the third constant potential to said third wiring;
   said fourth bias means includes a fourth semiconductor region formed in the surface area of said fourth well region and having an impurity concentration higher than that of said fourth well region, a fourth wiring connected to said fourth semiconductor region, and a fourth power source terminal for supplying the fourth constant potential to said fourth wiring; and
   said fifth bias means includes a fifth semiconductor region formed in the surface area of said semiconductor body and having an impurity concentration higher than that of said semiconductor body, a fifth wiring connected to said fifth semiconductor region, and a fifth power source terminal for supplying the fifth constant potential to said fifth wiring.

5. A semiconductor device according to claim 1, wherein said digital circuit uses a potential difference between said first and third constant potentials as an operating power source; and said analog circuit uses a potential difference between said second and fourth constant potentials as an operating power source.

6. A semiconductor device comprising:
   a semiconductor body of a first conductivity type;
   a first well region of a second conductivity type formed in said semiconductor body;
   a second well region of the second conductivity type formed in said semiconductor body;
   a third well region of the first conductivity type formed in said first well region;
   a fourth well region of the first conductivity type formed in said second well region;
   a fifth well region of the second conductivity type formed in said first well region;
   a sixth well region of the second conductivity type formed in said second well region;
   a digital circuit formed in said third and fifth well regions;
   an analog circuit formed in said fourth and sixth well regions;
   first bias means for biasing said first and fifth well regions by a first constant potential;
   second bias means for biasing said second and sixth well regions by a second constant potential;
   third bias means for biasing said third well region by a third constant potential;
   fourth bias means for biasing said fourth well region by a fourth constant potential;
   fifth bias means for biasing said semiconductor body by a fifth constant potential, said fifth bias means being independent from at least said third bias means;
   a first protection element formed in said semiconductor body and having a current path which is supplied with said first constant potential at one end thereof and supplied with said fifth constant potential at another end; and
   a second protection element formed in said semiconductor body having a current path which is supplied with said second constant potential at one end thereof and supplied with said fifth constant potential at another end.

7. A semiconductor device according to claim 6, wherein said first and second protection elements are formed in the surface area of that portion of said semiconductor body which lies between said first and second well regions.

8. A semiconductor device according to claim 7, wherein said first protection element is an insulated gate FET whose gate is connected to said fifth constant potential, and said second protection element is an insulated gate FET whose gate is connected to said fifth constant potential.

9. A semiconductor device according to claim 6, wherein:
   said first bias means includes a first semiconductor region formed in the surface area of said first well region and having an impurity concentration higher than that of said first well region, a first wiring connected to said first semiconductor region, and a first power source terminal for supplying the first constant potential to said first wiring;
   said second bias means includes a second semiconductor region formed in the surface area of said second well region and having an impurity concentration higher than that of said second well region, a second wiring connected to said second semiconductor region, and a second power source terminal for supplying the second constant potential to said second wiring;
   said third bias means includes a third semiconductor region formed in the surface area of said third well region and having an impurity concentration higher than that of said third well region, a third wiring connected to said third semiconductor region, and a third power source terminal for supplying the third constant potential to said third wiring;
   said fourth bias means includes a fourth semiconductor region formed in the surface area of said fourth well region and having an impurity concentration higher than that of said fourth well region, a fourth wiring connected to said fourth semiconductor region, and a fourth power source terminal for supplying the fourth constant potential to said fourth wiring; and
   said fifth bias means includes a fifth semiconductor region formed in the surface area of said semiconductor body and having an impurity concentration higher than that of said semiconductor body, a fifth wiring connected to said fifth semiconductor region, and a fifth power source terminal for supplying the fifth constant potential to said fifth wiring.

10. A semiconductor device according to claim 6, wherein said digital circuit uses a potential difference between said first and third constant potentials as an operating power source; and said analog circuit uses a potential difference between said second and fourth constant potentials as an operating power source.

11. A semiconductor device comprising:
    a semiconductor body of a first conductivity type;
    a first well region of a second conductivity type formed in said semiconductor body;
    a second well region of the second conductivity type formed in said semiconductor body;
    a third well region of the first conductivity type formed in said first well region;
    a fourth well region of the first conductivity type formed in said second well region;
    a digital circuit formed in said first and third well regions;
    an analog circuit formed in said second and fourth well regions;
    a first semiconductor region of the first conductivity type formed in the surface area of said semiconductor body to surround the surface area of said first well region and having an impurity concentration higher than that of said semiconductor body;
    a second semiconductor region of the first conductivity type formed in the surface area of said semiconductor body to surround the surface area of said second well region and having an impurity concentration higher than that of said semiconductor body;
    a third semiconductor region of the second conductivity type formed in the surface area of said first well region along a junction between said first well region and said semiconductor body and having an impurity concentration higher than that of said first well region;
    a fourth semiconductor region of the second conductivity type formed in the surface area of said second well region along a junction between said second well region and said semiconductor body and having an impurity concentration higher than that of said second well region;
    a fifth semiconductor region of the first conductivity type formed in the surface area of said third well region and having an impurity concentration higher than that of said third well region;

a sixth semiconductor region of the first conductivity type formed in the surface area of said fourth well region and having an impurity concentration higher than that of said fourth well region;

first bias means for biasing said first well region via said third semiconductor region by a first constant potential;

second bias means for biasing said second well region via said fourth semiconductor region by a second constant potential;

third bias means for biasing said third well region via said fifth semiconductor region by a third constant potential;

fourth bias means for biasing said fourth well region via said sixth semiconductor region by a fourth constant potential;

fifth bias means for biasing said semiconductor body via said first and second semiconductor regions by a fifth constant potential, said fifth bias means being independent from at least said third bias means;

a first protection element formed in said semiconductor body and having a current path which is supplied with said first constant potential at one end thereof and supplied with said fifth constant potential at another end; and a second protection element formed in said semiconductor body and having a current path which is supplied with said second constant potential at one end thereof and supplied with said fifth constant potential at another end.

12. A semiconductor device according to claim 11, wherein said first and second protection elements are formed in the surface area of that portion of said semiconductor body which lies between said first and second well regions.

13. A semiconductor device according to claim 11, wherein said first protection element is an insulated gate FET whose gate is connected to said fifth constant potential, and said second protection element is an insulated gate FET whose gate is connected to said fifth constant potential.

14. A semiconductor device according to claim 11, wherein:

said first bias means includes a first wiring connected to said third semiconductor region, and a first power source terminal for supplying the first constant potential to said first wiring;

said second bias means includes a second wiring connected to said fourth semiconductor region, and a second power source terminal for supplying the second constant potential to said second wiring;

said third bias means includes a third wiring connected to said fifth semiconductor region, and a third power source terminal for supplying the third constant potential to said third wiring;

said fourth bias means includes a fourth wiring connected to said sixth semiconductor region, and a fourth power source terminal for supplying the fourth constant potential to said fourth wiring; and said fifth bias means includes a fifth wiring connected to said first semiconductor region, a sixth wiring connected to said second semiconductor region, and a fifth power source terminal for supplying the fifth constant potential to said fifth and sixth wirings.

15. A semiconductor device according to claim 11, wherein said digital circuit uses a potential difference between said first and third constant potentials as an operating power source; and said analog circuit uses a potential difference between said second and fourth constant potentials as an operating power source.

16. A semiconductor device comprising:

a semiconductor body of a first conductivity type;

an analog circuit formed in said semiconductor body;

a digital circuit formed in said semiconductor body;

a first element formed in the surface area of said semiconductor body to constitute said analog circuit;

a second element formed in the surface area of said semiconductor body to constitute said digital circuit;

a semiconductor region of a second conductivity type formed in said semiconductor body, for isolating one of said first and second elements from said semiconductor body;

first power source means for supplying an operating power source voltage to said analog circuit;

second power source means for supplying an operating power source voltage to said digital circuit; and bias means for applying a bias potential to said semiconductor body, said bias potential being derived from a power source different from said second power source means.

17. A semiconductor device according to claim 16, wherein:

said first power source means includes a first high potential power source terminal, a first wiring for connecting said first high potential power source terminal to said analog circuit, a first low potential power source terminal, and a second wiring for connecting said first low potential power source terminal to said analog circuit;

said second power source means includes a second high potential power source terminal, a third wiring for connecting said second high potential power source terminal to said digital circuit, a second low potential power source terminal, and a fourth wiring for connecting said second low potential power source terminal to said digital circuit; and said bias means includes a fifth wiring for connecting said semiconductor body to a power source terminal which is different from said second low potential power source terminal and second high potential power source terminal.

18. A semiconductor device according to claim 7, wherein said fifth wiring connects said semiconductor body to a third low potential power source terminal which is different from said first and second low potential power source terminals.

19. A semiconductor device according to claim 16, further comprising:

a protection circuit formed in said semiconductor body;

a first protecting element formed in said protection circuit and having a current path which is connected at one end to said first high potential power source terminal and connected at another end to said third low potential power source terminal; and a second protecting element formed in said protection circuit and having a current path which is connected at one end to said second high potential power source terminal and connected at another end to said third low potential power source terminal.

20. A semiconductor device according to claim 19, wherein said first protecting element is an insulated gate FET having a gate connected to said third low potential power source terminal; and said second protecting element is an insulated gate FET having a gate connected to said third low potential power source terminal.

21. A semiconductor device according to claim 2, wherein:
   said first protection element comprises a diode having an anode connected to said first constant potential and a cathode connected to said fifth constant potential; and
   said second protection circuit element comprises a diode having an anode connected to said second constant potential and a cathode connected to said fifth constant potential.

22. A semiconductor device according to claim 2, wherein said fifth biasing means is independent from said fourth biasing means.

23. A semiconductor device according to claim 22, wherein said fifth biasing means is independent from said first biasing means and said second biasing means.

24. A semiconductor device according to claim 7, wherein:
   said first protection element comprises a diode having an anode connected to said first constant potential and a cathode connected to said fifth constant potential; and
   said second protection circuit element comprises a diode having an anode connected to said second constant potential and a cathode connected to said fifth constant potential.

25. A semiconductor device according to claim 7, wherein said fifth biasing means is independent from said fourth biasing means.

26. A semiconductor device according to claim 25, wherein said fifth biasing means is independent from said first biasing means and said second biasing means.

27. A semiconductor device comprising:
   a semiconductor body of a first conductivity type;
   a first well region of a second conductivity type formed in said semiconductor body;
   a second well region of the second conductivity type formed in said semiconductor body;
   a third well region of the first conductivity type formed in said first well region;
   a fourth well region of the first conductivity type formed in said second well region;
   a digital circuit formed in said first and third well regions;
   an analog circuit formed in said second and fourth well regions;
   first bias means for biasing said first well region by a first constant potential;
   second bias means for biasing said second well region by a second constant potential;
   third bias means for biasing said third well region by a third constant potential;
   fourth bias means for biasing said fourth well region by a fourth constant potential; and
   fifth bias means for biasing said semiconductor body by a fifth constant potential, wherein said fifth bias means is different from said third bias means.

28. A semiconductor device according to claim 27, wherein said fifth bias means is coupled to said semiconductor body in a region between said first and second well regions.

29. A semiconductor device according to claim 28, further comprising:
   a first protection circuit element formed in said semiconductor body and having a first terminal supplied with said first constant potential and a second terminal supplied with said fifth constant potential from said fifth bias means; and
   a second protection circuit element formed in said semiconductor body having a first terminal supplied with said second constant potential and a second terminal supplied with said fifth constant potential from said fifth bias means, wherein each of said first and second protection circuit elements are formed between said first and second well regions.

30. A semiconductor device according to claim 29, wherein:
   said first protection circuit element comprises an insulated gate FET having a gate coupled to said fifth constant potential and a drain coupled to said first constant potential; and
   said second protection circuit element comprises an insulated gate FET having a gate coupled to said fifth constant potential and a drain coupled to said second constant potential.

31. A semiconductor device according to claim 29, wherein:
   said first protection circuit element comprises a diode having an anode coupled to said first constant potential and a cathode coupled to said fifth constant potential; and
   said second protection circuit element comprises a diode having an anode coupled to said second constant potential and a cathode coupled to said fifth constant potential.

32. A semiconductor device according to claim 29, wherein said fifth bias means is different from said fourth bias means.

33. A semiconductor device according to claim 32, wherein said fifth bias means is different from said first bias means and said second bias means.

* * * * *